(12) United States Patent
Itoh et al.

(10) Patent No.: US 6,235,564 B1
(45) Date of Patent: May 22, 2001

(54) METHOD OF MANUFACTURING MISFET

(75) Inventors: Yasuyoshi Itoh; Yasuo Inoue; Hidekazu Oda, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/487,620

(22) Filed: Jan. 20, 2000

(30) Foreign Application Priority Data

Jul. 27, 1999 (JP) ................................................. 11-211800

(51) Int. Cl.[7] .................................................. H01L 21/338
(52) U.S. Cl. ............................................ 438/183; 438/306
(58) Field of Search ..................................... 438/183, 197, 438/306, 305, 304, 303, 299; 257/192

(56) References Cited

U.S. PATENT DOCUMENTS

| | | | |
|---|---|---|---|
| 5,227,326 | * 7/1993 | Walker | 437/52 |
| 5,672,890 | * 9/1997 | Nakajima | 257/192 |
| 6,096,641 | * 8/2000 | Kunikiyo | 438/653 |

FOREIGN PATENT DOCUMENTS

| | | |
|---|---|---|
| 3-250741 | 11/1991 | (JP) . |
| 6-342810 | 12/1994 | (JP) . |
| 9-246543 | 9/1997 | (JP) . |

OTHER PUBLICATIONS

"CMOS Metal Replacement Gate Transistors Using Tantalum Pentoxide Gate Insulator", by A. Chatterjee et al., 1998 IEEE, IEDM, pp. 777–780.

"High Performance Metal Gate MOSFETs Fabricated by CMP for 0.1 μm Regime", by Atsushi Yagishita et al., 1998 IEEE, IEDM, pp. 785–788.

* cited by examiner

Primary Examiner—Matthew Smith
Assistant Examiner—Renzo N. Rocchegiani
(74) Attorney, Agent, or Firm—McDermott, Will & Emery

(57) ABSTRACT

A method of manufacturing a MISFET includes the steps of forming a gate insulation film (2) on a semiconductor substrate (1), forming a dummy gate (3B) made of a material having an etch selectivity relative to the material of the gate insulation film (2) on the gate insulation film (2), implanting an impurity into the semiconductor substrate (1), forming an interlayer insulation film (7), made of a material having an etch selectivity relative to the material of the dummy gate (3B) on a side surface of the dummy gate (3B), etching away the dummy gate (3B), and filling a space in which the dummy gate (3B) has been present with a gate electrode material of metal. Gradually thinning the dummy gate in the step of impurity implantation allows the formation of LDD regions and the patterning of a gate electrode below a minimum patterning size limit of a photolithographic technique. The method eliminates the need to take into consideration an etch selectivity between the gate electrode material and the gate insulation film material to manufacture an all-metal gate electrode.

17 Claims, 26 Drawing Sheets

METHOD OF MANUFACTURING MISFET

BACKGROUND OF THE INVENTION

1. Field of the Invention

The present invention relates to a method of manufacturing a MISFET (Metal Insulator Semiconductor Field Effect Transistor) and, more particularly, to a method of manufacturing a MISFET having a gate electrode made of only metal.

2. Description of the Background Art

In recent years, there has been a demand for higher-speed operation and higher integration of semiconductor devices. Gate electrode patterns of MISFETs accordingly have been decreasing in size. However, the decrease in the size of the gate electrode patterns increases electric resistance. To solve this problem, a gate electrode made of a polycide constructed such that a compound film (silicide film) of high-melting-point metal such as tungsten with silicon is formed on a polysilicon film has been recently used in place of a gate electrode made of only polysilicon which has been historically dominant.

With further decrease in gate electrode pattern size, the polycide film cannot meet the requirement for sufficiently low electric resistance of the gate electrode. To overcome this problem, a structure such that a metal film, rather than the silicide film which is a compound, is formed on the polysilicon film has been under study (as disclosed, for example, in Japanese Patent Application Laid-Open No. P09-246543A (1997)).

For still further decrease in electric resistance of the gate electrode, it is desirable that the entire gate electrode is made of metal without using polysilicon.

It is contemplated that the gate electrode made of metal may be manufactured by a background art method to be described below. Initially, as shown in FIG. 48, a gate insulation film material 2, a gate electrode material 11 which is metal and a photoresist 10 are formed on a surface of a semiconductor substrate 1, and the photoresist 10 is patterned. Using the patterned photoresist 10 as a mask, etching is performed to shape the gate electrode material 11 into a gate electrode. Then, the photoresist 10 is removed, as shown in FIG. 49. This completes a MIS gate structure.

However, the use of the above described background art manufacturing method presents a problem to be described below.

The gate electrode material 11 which is metal such as tungsten is often etched by dry etching using $BCl_3$ gas, $SF_6$ gas or the like. These gases contain boron and fluorine which are more reactive than oxygen and thus serve as a reductant. Thus, if a silicon oxide film or other oxygen-containing insulation films are used as the gate insulation film material 2, boron and fluorine are prone to substitute for oxygen contained in the gate insulation film material 2 to combine with silicon. As a result, there is a likelihood that the etching of the gate electrode material 11 removes the gate insulation film material 2 and also the semiconductor substrate 1. Thus, it is difficult to ensure an etch selectivity between the gate electrode material 11 and the gate insulation film material 2.

SUMMARY OF THE INVENTION

According to a first aspect of the present invention, a method of manufacturing a MISFET comprises the steps of: (a) preparing a semiconductor substrate; (b) forming a gate insulation film on a surface of the semiconductor substrate; (c) forming a dummy gate on a surface of the gate insulation film; (d) implanting an impurity into the semiconductor substrate in a self-aligned manner, using the dummy gate as a mask; (e) forming an interlayer insulation film to cover the surface of the semiconductor substrate entirely; (f) reducing the thickness of the interlayer insulation film to leave the interlayer insulation film only on a side of the dummy gate; (g) removing the dummy gate, with the interlayer insulation film and the gate insulation film left unremoved; and (h) forming a gate electrode in a space created by the removal of the dummy gate.

Preferably, according to a second aspect of the present invention, in the method of the first aspect, the gate insulation film, the dummy gate and the interlayer insulation film are made of respective materials capable of providing an etch selectivity between the gate insulation film and the dummy gate and an etch selectivity between the interlayer insulation film and the dummy gate; and the step (g) comprises the step of providing the etch selectivity between the gate insulation film and the dummy gate and the etch selectivity between the interlayer insulation film and the dummy gate to etch the dummy gate.

Preferably, according to a third aspect of the present invention, the method of the first aspect further comprises the step of (i) reducing a gate length of the dummy gate.

Preferably, according to a fourth aspect of the present invention, in the method of the third aspect, the gate insulation film, the dummy gate and the interlayer insulation film are made of respective materials capable of providing an etch selectivity between the gate insulation film and the dummy gate and an etch selectivity between the interlayer insulation film and the dummy gate. The step (g) comprises the step of providing the etch selectivity between the gate insulation film and the dummy gate and the etch selectivity between the interlayer insulation film and the dummy gate to etch the dummy gate. The step (i) comprises the step of providing the etch selectivity between the gate insulation film and the dummy gate to isotropically etch the dummy gate.

Preferably, according to a fifth aspect of the present invention, in the method of the third aspect, the dummy gate has an upper part and a lower part; and the gate length of only the lower part of the dummy gate is reduced in the step (i).

Preferably, according to a sixth aspect of the present invention, in the method of the fifth aspect, the gate insulation film, the upper part and the lower part of the dummy gate and the interlayer insulation film are made of respective materials capable of providing an etch selectivity between the gate insulation film and the lower part of the dummy gate, an etch selectivity between the lower part of the dummy gate and the upper part of the dummy gate, an etch selectivity between the upper part of the dummy gate and the interlayer insulation film, and an etch selectivity between the lower part of the dummy gate and the interlayer insulation film. The step (g) comprises the step of providing the etch selectivity between the gate insulation film and the lower part of the dummy gate, the etch selectivity between the upper part of the dummy gate and the interlayer insulation film and the etch selectivity between the lower part of the dummy gate and the interlayer insulation film to etch the upper and lower parts of the dummy gate. The step (i) comprises the step of providing the etch selectivity between the gate insulation film and the lower part of the dummy gate and the etch selectivity between the lower part of the dummy gate and the upper part of the dummy gate to isotropically etch the lower part of the dummy gate.

Preferably, according to a seventh aspect of the present invention, in the method of any one of the third to sixth aspects, the steps (d) and (i) are repeated a plurality of times before the step (e).

The use of the method according to the first aspect of the present invention eliminates the need to take into consideration an etch selectivity between the gate electrode material and the gate insulation film material to manufacture the MISFET including an all-metal gate electrode. The method according to the first aspect does not use a lift-off process to remove the interlayer insulation film overlying the dummy gate. This provides the dummy gate of a height equal to the thickness of the interlayer insulation film, eliminating the need to make the dummy gate higher than necessary. The presence of the gate insulation film prevents the semiconductor substrate from being damaged during the removal of the dummy gate.

The method according to the second aspect of the present invention provides the etch selectivity between the gate insulation film and the dummy gate and the etch selectivity between the interlayer insulation film and the dummy gate. Therefore, there is little likelihood that the interlayer insulation film and the gate insulation film are damaged during the removal of the dummy gate.

The method according to the third aspect of the present invention can form active regions functioning as LDD regions or nonuniformly doped channel regions in the surface of the semiconductor substrate on opposite sides of the gate electrode, and manufacture the MISFET including the gate electrode having a gate length that is not greater than a minimum patterning size limit of a photolithographic technique.

The method according to the fourth aspect of the present invention employs isotropic etching to reduce the gate length of the dummy gate, achieving precise control of the gate length. Furthermore, the method according to the fourth aspect of the present invention provides the etch selectivity between the gate insulation film and the dummy gate and the etch selectivity between the interlayer insulation film and the dummy gate. Therefore, there is little likelihood that the interlayer insulation film and the gate insulation film are damaged during the removal of the dummy gate.

The method according to the fifth aspect of the present invention can manufacture the MISFET including the gate electrode which is low in electric resistance and which has the easy-to-contact upper part.

The method according to the sixth aspect of the present invention employs isotropic etching to reduce the gate length of the lower part of the dummy gate, achieving precise control of the gate length. Furthermore, the method according to the sixth aspect of the present invention provides the etch selectivity between the gate insulation film and the lower part of the dummy gate and the etch selectivity between the interlayer insulation film and the upper and lower parts of the dummy gate. Therefore, there is little likelihood that the interlayer insulation film and the gate insulation film are damaged during the removal of the dummy gate.

The method according to the seventh aspect of the present invention can provide active regions and nonuniformly doped channel regions differing in concentration from each other in the surface of the semiconductor substrate on opposite sides of the gate electrode.

It is therefore an object of the present invention to provide a method of manufacturing a MISFET, which is capable of manufacturing an all-metal gate electrode without the need to take into consideration an etch selectivity between a gate electrode material and a gate insulation film material.

It is another object of the present invention to provide such a method of manufacturing a MISFET, which is capable of manufacturing a gate electrode having a gate length that is not greater than a minimum patterning size limit of a photolithographic technique.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A method of manufacturing a MISFET according to a first preferred embodiment of the present invention comprises: forming a fake gate electrode (referred to hereinafter as a dummy gate) on a semiconductor substrate with a gate insulation film material formed thereon; forming an interlayer insulation film on a side surface of the dummy gate after an impurity ion implantation process; removing the dummy gate; and filling a space in which the dummy gate has been present with a gate electrode material. This manufacturing method will be described with reference to FIGS. 1 through 12.

Initially, a gate insulation film material 2 and a dummy gate material 3 are stacked in the order named on a surface of a semiconductor substrate 1 such as a silicon substrate by a thermal oxidation, CVD or sputtering process. Silicon oxide, for example, is used as the gate insulation film material 2, in which case a film of silicon oxide is formed by a thermal oxidation process (including RTO (Rapid Thermal Oxidation)). The dummy gate material 3 used herein is a material having an etch selectivity relative to the gate insulation film material 2. When the gate insulation film material 2 is silicon oxide, an example of the dummy gate material 3 is silicon nitride. It is assumed that an isolation region, a well, a channel stopper region and a doped channel region are formed in the semiconductor substrate 1 before the gate insulation film material 2 and the dummy gate material 3 are formed.

Figure 1:
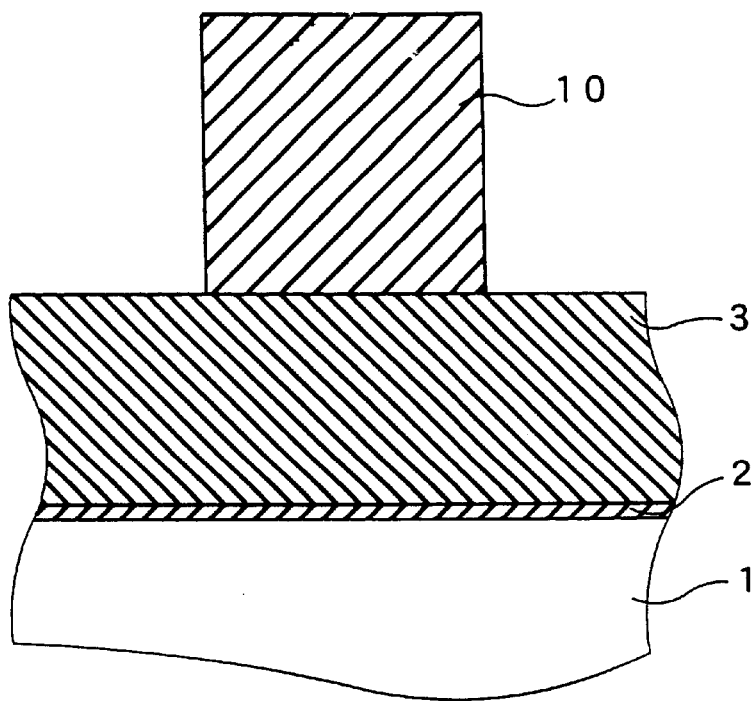
FIGS. 1 through 17 are cross-sectional views showing respective steps in a method of manufacturing a MISFET according to a first preferred embodiment of the present invention.
Figure 2:
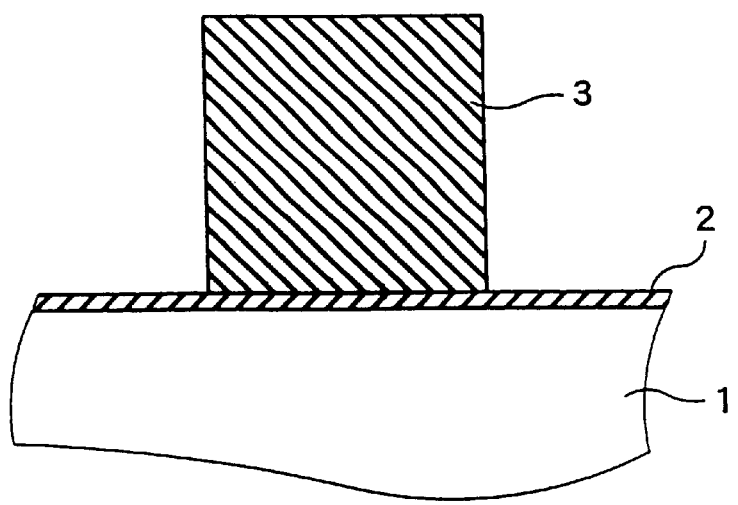

A photoresist 10 is formed on a surface of the dummy gate material 3 and is then patterned using a photolithographic technique (FIG. 1). Using the photoresist 10 as a mask, etching (e.g., highly anisotropic dry etching) is performed to shape the dummy gate material 3. The photoresist 10 is then removed (FIG. 2). The etch selectivity between the gate insulation film material 2 and the dummy gate material 3 allows the patterning of only the dummy gate material 3 without affecting the gate insulation film material 2.

Figure 3:
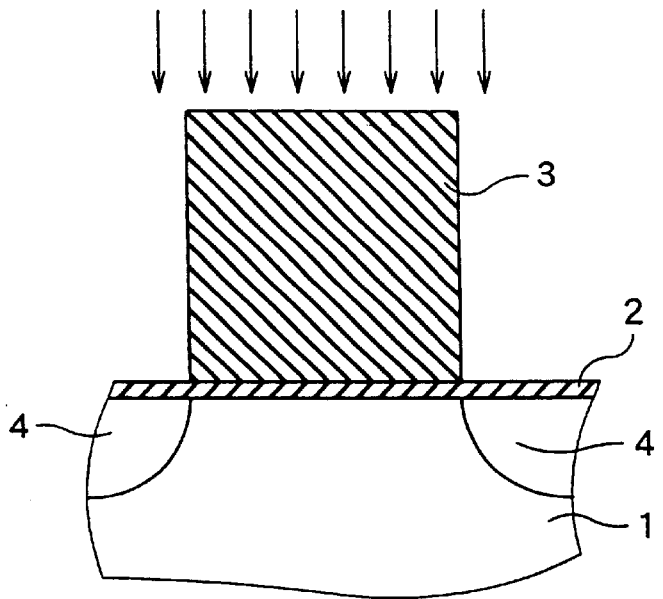

Next, an impurity is implanted into the semiconductor substrate 1 using the dummy gate 3 as a mask to form active regions 4 having a relatively high concentration and serving as source/drain regions of the MISFET in the surface of the semiconductor substrate 1 in a self-aligned manner (FIG. 3). For the manufacture of an n-channel MISFET, for example, an n type impurity such as phosphorus or arsenic is implanted. Since the thickness of the gate insulation film generally ranges from several nanometers to tens of nanometers, the gate insulation film material 2 presents no obstacle when the active regions 4 are formed.

Figure 4:
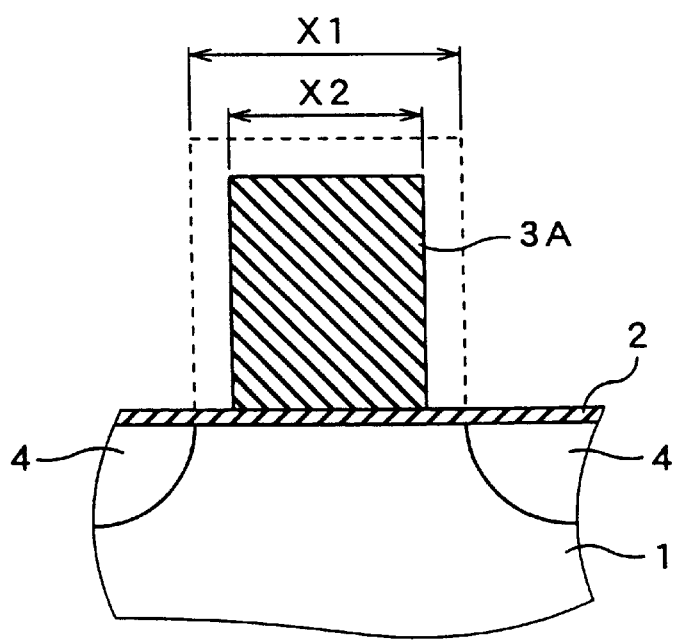

Subsequently, isotropic etching is performed to reduce the gate length of the dummy gate 3, forming a dummy gate 3A. The gate length X 2 of the dummy gate 3A is less than the gate length X 1 of the dummy gate 3 obtained in the patterning step using the photolithographic technique (FIG. 4). Since the isotropic etching is used to reduce the gate length of the dummy gate 3, the gate length is accurately controlled by adjusting the etch time. For example, when the dummy gate material 3 is silicon nitride, the isotropic etching may be wet etching using phosphoric acid at elevated temperatures.

Figure 5:
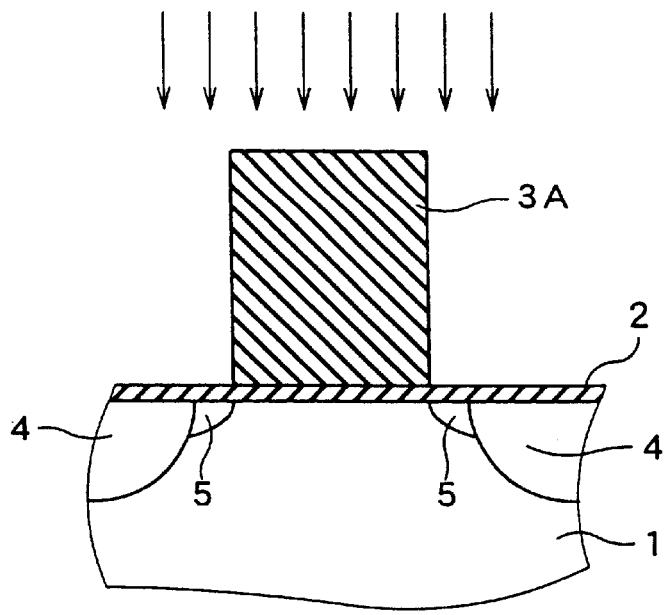

Then, an impurity is implanted into the semiconductor substrate 1 using the dummy gate 3A as a mask to form active regions 5 having a concentration relatively lower than that of the active regions 4 and serving as LDD (Lightly Doped Drain) regions in the surface of the semiconductor substrate 1 in a self-aligned manner (FIG. 5). For the manufacture of an n-channel MISFET, for example, an n type impurity such as phosphorus or arsenic is implanted, as in the formation of the active regions 4 and 5.

Figure 6:
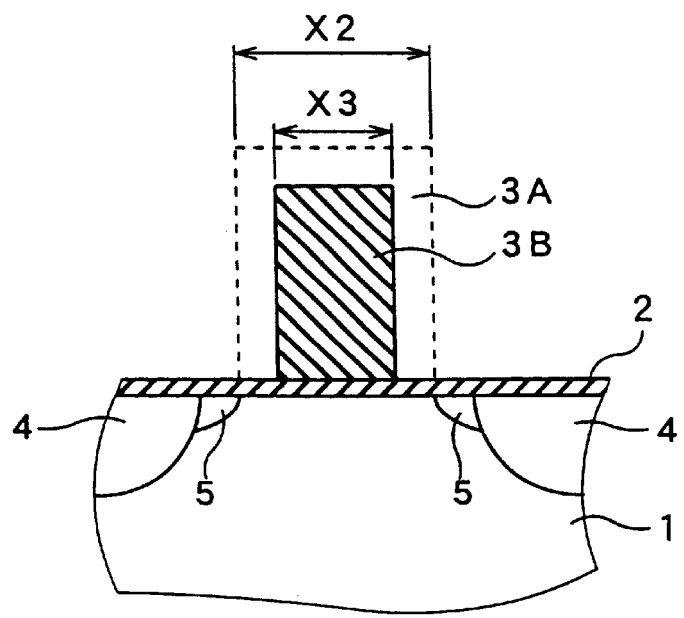

Next, isotropic etching is performed again to form a dummy gate 3B having a gate length X3 that is less than the gate length X2 of the dummy gate 3A (FIG. 6).

Figure 7:
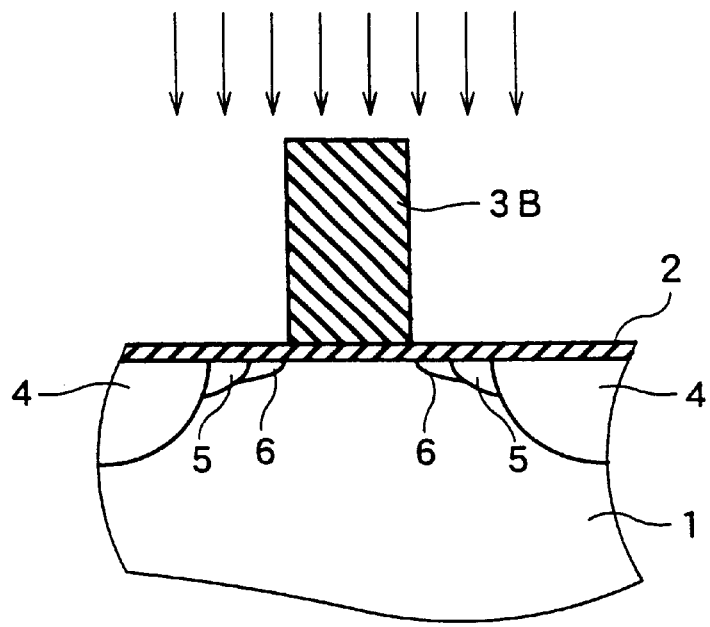

Then, an impurity is implanted into the semiconductor substrate 1 using the dummy gate 3B as a mask to form nonuniformly doped channel regions 6 having an impurity characteristic opposite from that of the active regions 4 and 5 and a relatively high concentration in the surface of the semiconductor substrate 1 in a self-aligned manner (FIG. 7). For the manufacture of an n-channel MISFET, for example, a p type impurity such as boron is implanted, which is opposite from the conductivity type of the active regions 4 and 5. The nonuniformly doped channel regions are regions formed for the purpose of improving a source/drain breakdown voltage when the gate length is small, and are also referred to as "pocket implantation regions."

Figure 8:
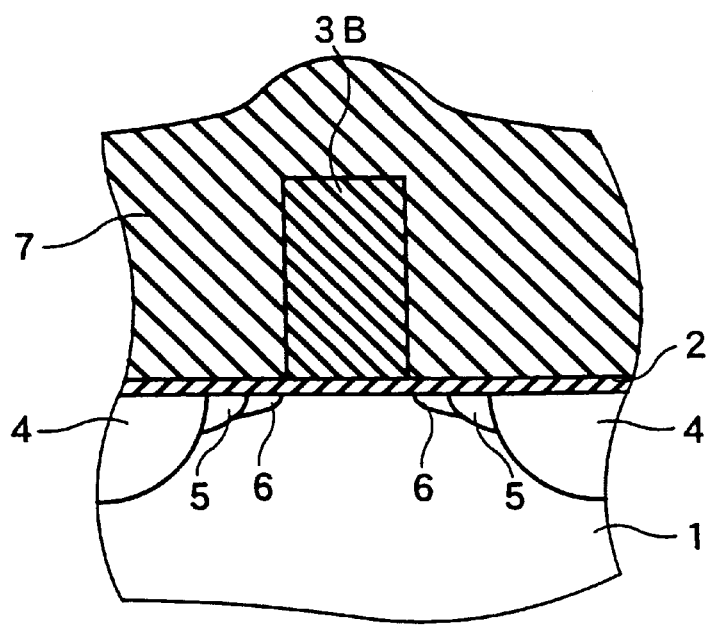

Thereafter, an interlayer insulation film 7 is formed on the entire top surface of the semiconductor substrate 1 using a CVD or sputtering process to cover the gate insulation film material 2 and the dummy gate 3B (FIG. 8). The interlayer insulation film 7 is made of a material having an etch selectivity relative to the dummy gate material 3. When the dummy gate material 3 is silicon nitride, the interlayer insulation film 7 is made of, for example, silicon oxide.

Figure 9:
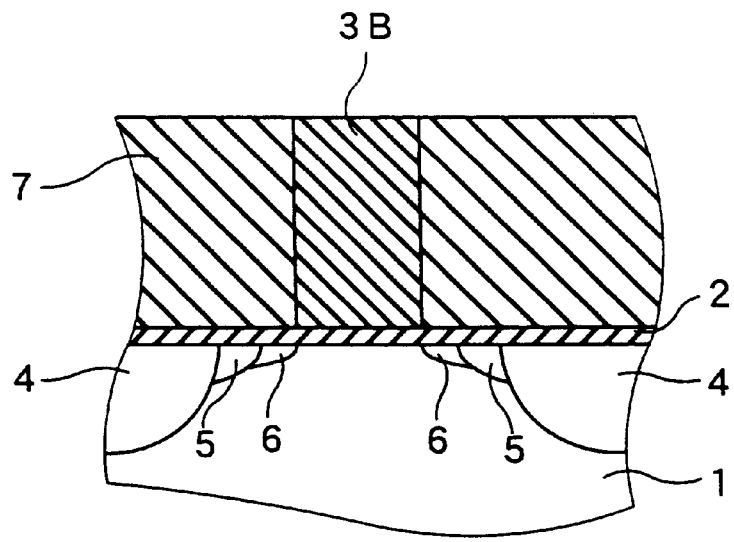

The interlayer insulation film 7 is polished by a CMP (Chemical Mechanical Polishing) process for reduction in thickness until the top of the dummy gate 3B is exposed (FIG. 9). At this time, it is desirable to use a polishing agent which provides a polish selectivity between the dummy gate 3B and the interlayer insulation film 7 so that when the top of the dummy gate 3B is exposed is detected. An example of the polishing agent which provides the polish selectivity between the silicon nitride film and the silicon oxide film is $CeO_2$. If it is difficult to ensure the polish selectivity between the interlayer insulation film 7 and the dummy gate 3B because of the combination of materials, the polishing time may be controlled so that the surface of the interlayer insulation film 7 is polished until the top of the dummy gate 3B is exposed. In either case, the interlayer insulation film 7 is required only to cover a side surface of the dummy gate 3B.

Figure 10:
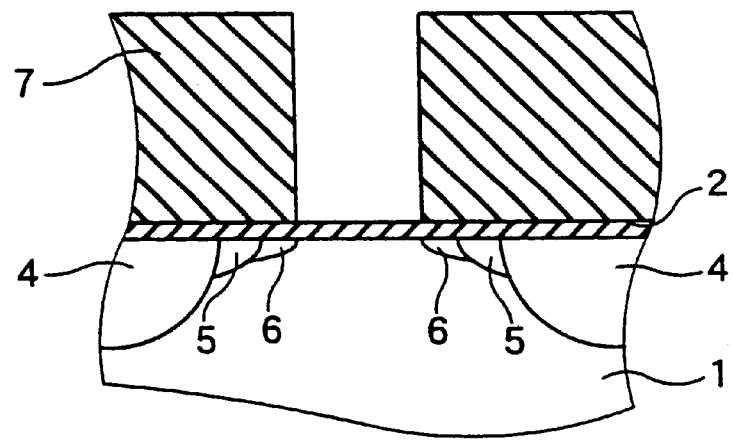

The dummy gate 3B is removed, with the interlayer insulation film 7 and the gate insulation film material 2 left unremoved (FIG. 10). The above described etch selectivities between the dummy gate 3B and the gate insulation film material 2 and between the dummy gate 3B and the interlayer insulation film 7 allow the removal of only the dummy gate 3B. When the material of the dummy gate 3B is silicon nitride and the gate insulation film material 2 and the material of the interlayer insulation film 7 are silicon oxide, the dummy gate 3B may be removed, for example, by wet etching using phosphoric acid at elevated temperatures.

Figure 11:
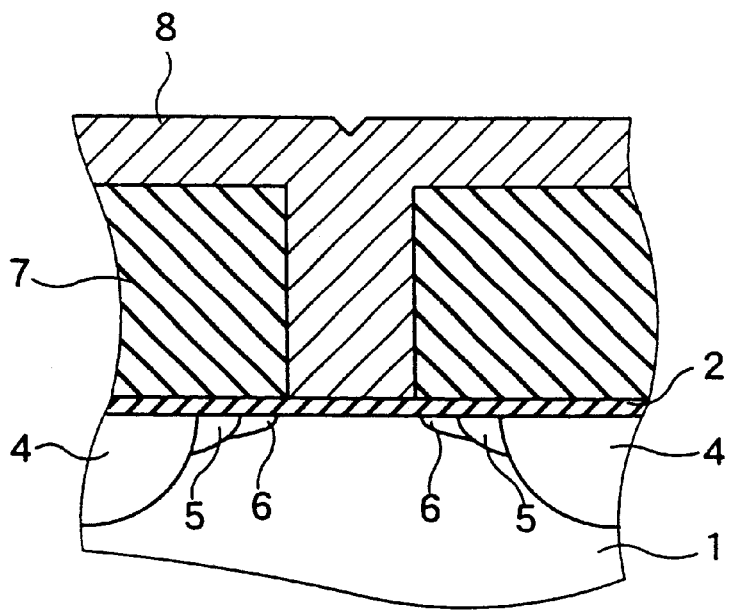

Subsequently, a gate electrode material 8 is formed using a CVD, sputtering or electroplating process to cover the gate insulation film material 2 and the interlayer insulation film 7 (FIG. 11). The gate electrode material 8 may be metal such as aluminum, tungsten or copper. Of course, the gate electrode material 8 can be doped polysilicon or amorphous silicon which has been used in the background art MISFET.

Figure 12:
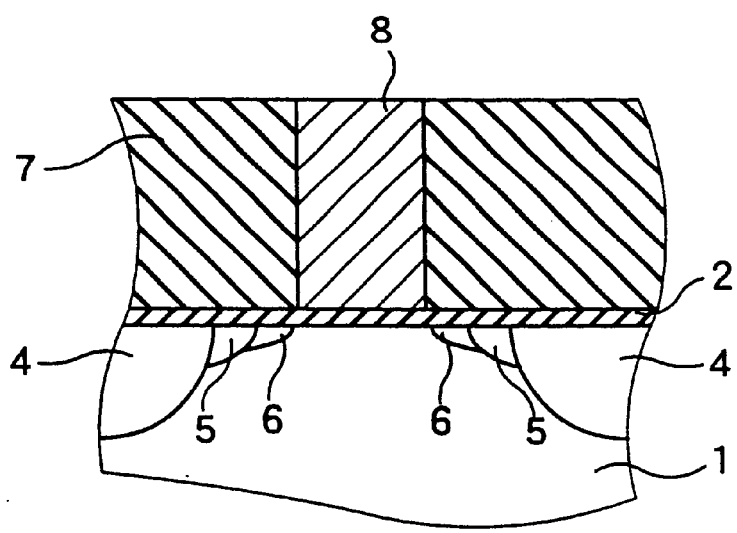
Figure 50:
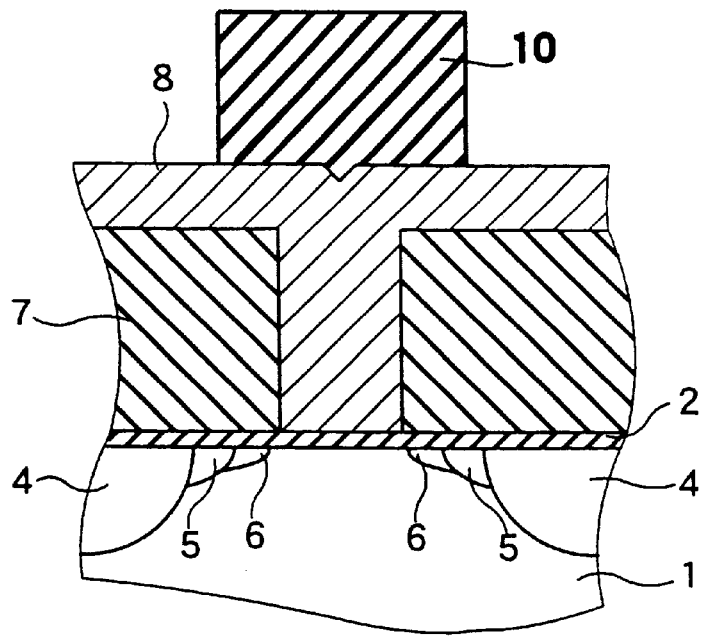
FIGS. 50 and 51 are cross-sectional views showing respective steps in the method of manufacturing the MISFET according to the first preferred embodiment.
Figure 51:
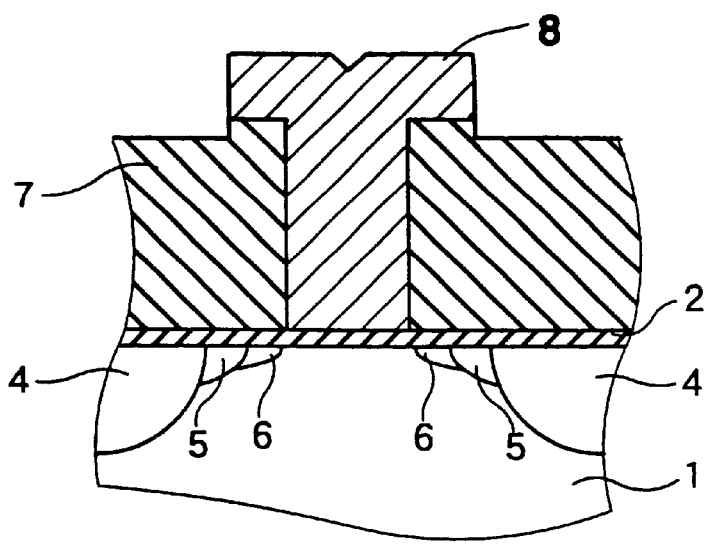

Part of the gate electrode material 8 which overlies the interlayer insulation film 7 is removed by etchback or a CMP process so that the gate electrode material 8 is left only in a region wherein the dummy gate 3B has been present (FIG. 12). Alternatively, the gate electrode material 8 may be shaped by a photolithographic technique. In this case, subsequently to the step shown in FIG. 11, the photoresist 10 is formed on the gate electrode material 8 and is then patterned (FIG. 50). Using the patterned photoresist 10 as a mask, dry etching is performed to remove part of the gate electrode material 8 which is not covered with the photoresist 10 (FIG. 51). This method produces a gate electrode of a T-shaped configuration, as shown in FIG. 51. The use of the dry etching for shaping of the gate electrode material 8 might raise the fear that the interlayer insulation film 7 is removed. As described above, the dry etching of the metal film such as tungsten removes a silicon oxide film and other oxygen-containing insulation films which are present around the metal film. Thus, when the gate electrode material 8 is made of metal such as tungsten and the interlayer insulation film 7 is made of silicon oxide, the interlayer insulation film 7 is, of course, removed to some extent. However, since the interlayer insulation film 7 is sufficiently thick unlike the gate insulation film 2, there is substantially no problem if the interlayer insulation film 7 is somewhat removed. Additionally, other etching processes such as wet etching may be adopted to etch the gate electrode material 8 so long as the interlayer insulation film 7 is not extremely removed.

This completes the MISFET including an all-metal gate electrode.

Figure 13:
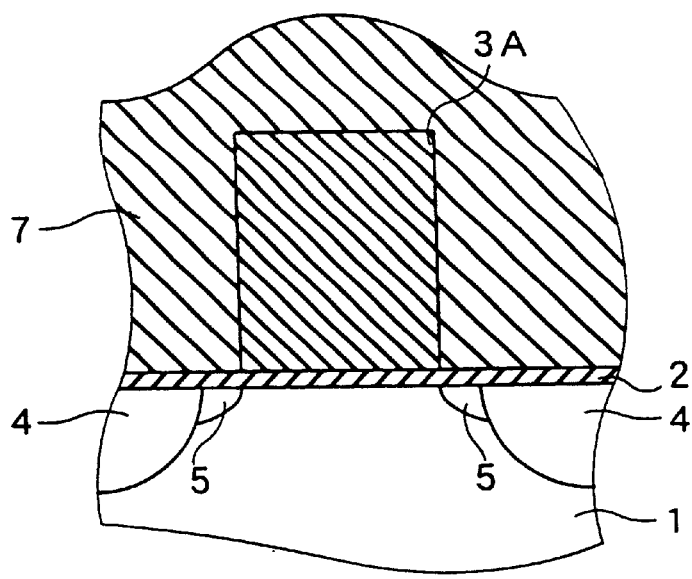
Figure 14:
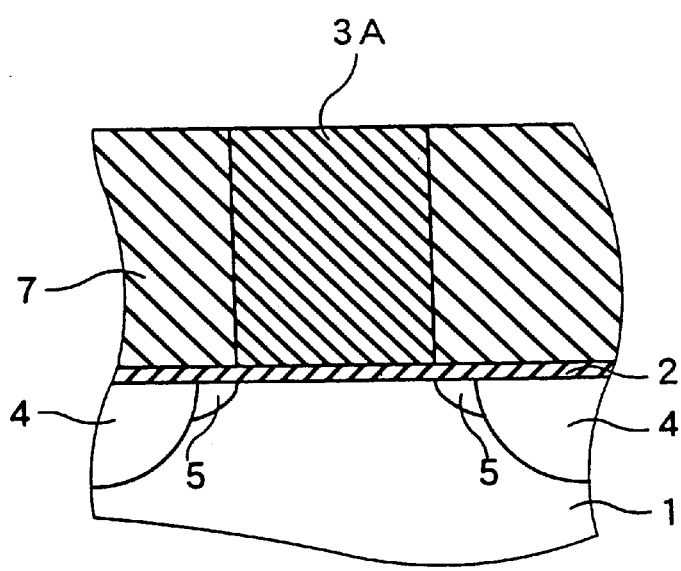
Figure 15:
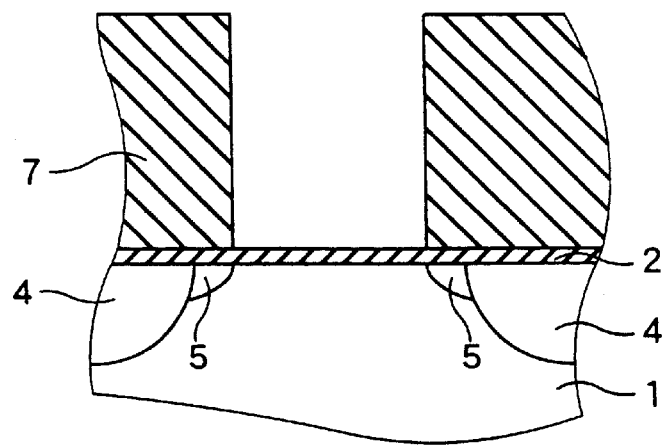
Figure 16:
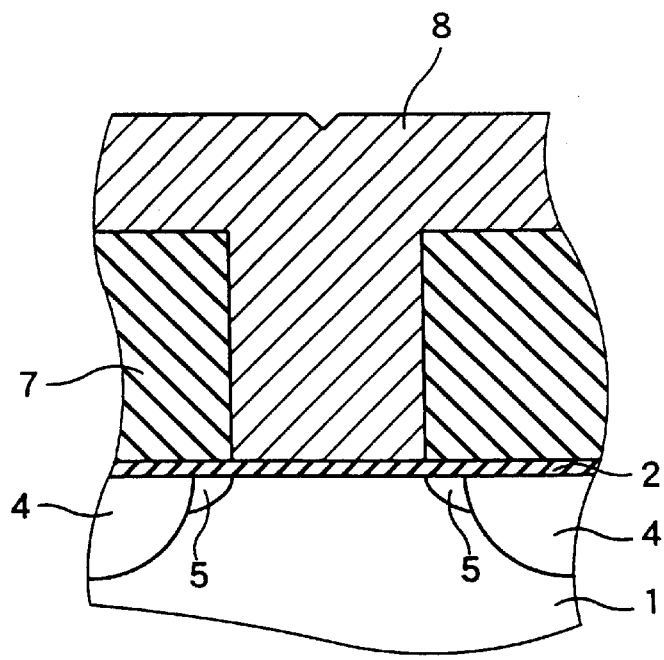
Figure 17:
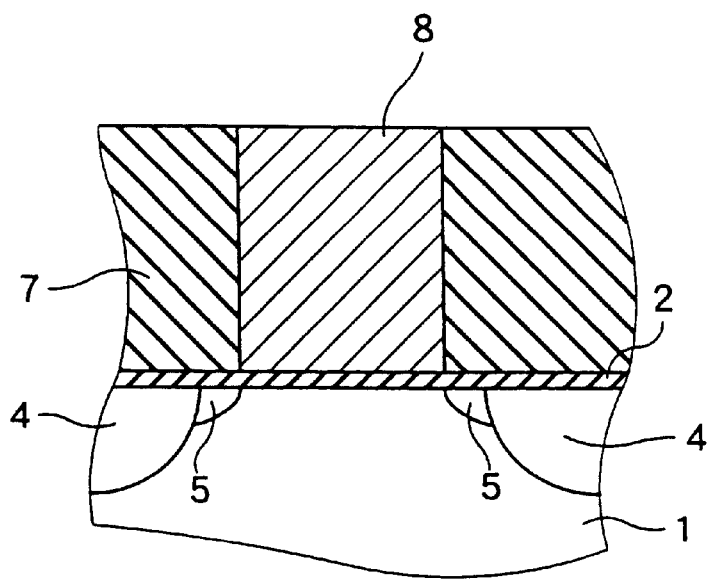

The above-mentioned step of forming the nonuniformly doped channel regions 6 may be eliminated. In this case, the steps shown in FIGS. 13 through 17 are performed after the step, shown in FIG. 5, of forming the active regions 5 in the surface of the semiconductor substrate 1. More specifically, after the step shown in FIG. 5, the interlayer insulation film 7 is formed on the entire top surface of the semiconductor substrate 1 using the CVD or sputtering process to cover the gate insulation film material 2 and the dummy gate 3A (FIG. 13). The interlayer insulation film 7 is polished by the CMP process for reduction in thickness until the top of the dummy gate 3A is exposed (FIG. 14). The dummy gate 3A is removed, with the interlayer insulation film 7 and the gate insulation film material 2 left unremoved (FIG. 15). Subsequently, the gate electrode material 8 is formed using the CVD, sputtering or electroplating process to cover the gate insulation film material 2 and the interlayer insulation film 7 (FIG. 16). Part of the gate electrode material 8 which overlies the interlayer insulation film 7 is removed by etchback or the CMP process so that the gate electrode material 8 is left only in a region wherein the dummy gate 3A has been present (FIG. 17). Alternatively, the gate electrode material 8 may be patterned by a photolithographic technique in a manner described with reference to FIGS. 50 and 51.

Although not shown, the step of forming the active regions 5 in addition to the step of forming the nonuniformly doped channel regions 6 may be eliminated. In this case, after the step, shown in FIG. 3, of forming the active regions 4 in the surface of the semiconductor substrate 1, the interlayer insulation film 7 is formed on the entire top surface of the semiconductor substrate 1 using the CVD or sputtering process to cover the gate insulation film material 2 and the dummy gate 3. The interlayer insulation film 7 is polished by the CMP process for reduction in thickness until the top of the dummy gate 3 is exposed. The dummy gate 3 is removed, with the interlayer insulation film 7 and the gate insulation film material 2 left unremoved. Subsequently, the gate electrode material 8 is formed using the CVD, sputtering or electroplating process to cover the gate insulation film material 2 and the interlayer insulation film 7. Part of the gate electrode material 8 which overlies the interlayer insulation film 7 is removed by etchback or the CMP process so that the gate electrode material 8 is left only in a region wherein the dummy gate 3 has been present. Alternatively, the gate electrode material 8 may be patterned by a photolithographic technique in a manner described with reference to FIGS. 50 and 51.

The gate insulation film material 2, the dummy gate material 3 and the material of the interlayer insulation film 7 are not limited to silicon oxide and silicon nitride, but are required only to have an etch selectivity. Table 1 shows an example of combinations of the gate insulation film material 2, the dummy gate material 3 and the material of the interlayer insulation film 7.

TABLE 1

| gate insulation film 2 | dummy gate 3 | interlayer insulation film 7 |
| --- | --- | --- |
| silicon oxide | silicon nitride | silicon oxide |
|  | poly/amorphous silicon | silicon nitride |
|  |  | silicon oxide |
| silicon oxynitride | poly/amorphous silicon | silicon oxide |
|  |  | silicon nitride |
|  | silicon oxide | silicon nitride |

TABLE 1-continued

| gate insulation film 2 | dummy gate 3 | interlayer insulation film 7 |
| --- | --- | --- |
| high dielectric | silicon nitride | silicon oxide |
|  | poly/amorphous silicon | silicon oxide |
|  |  | silicon nitride |
|  | silicon oxide | silicon nitride |

Polysilicon or amorphous silicon, silicon oxide and silicon nitride have an etch selectivity relative to each other, and therefore may be used in combination as shown in Table 1 for the parts of the MISFET. This permits the removal of the dummy gate 3B, with the interlayer insulation film 7 and the gate insulation film material 2 left unremoved.

As shown in Table 1, silicon oxynitride may be used as the gate insulation film material 2. In this case, if silicon oxynitride has a nitrogen content higher than an oxygen content, silicon oxide may be used as the dummy gate material 3 as shown in Table 1. However, if silicon oxynitride has an oxygen content higher than a nitrogen content, silicon nitride and silicon oxide may be used as the dummy gate material 3 and the material of the interlayer insulation film 7, respectively.

Silicon nitride may be used as the gate insulation film material 2 where feasible. Materials to be used in this case as the dummy gate material 3 and for the interlayer insulation film 7 may be similar to those used when the gate insulation film material 2 is silicon oxynitride in Table 1.

Alternatively, a high dielectric may be used as the gate insulation film material 2. Examples of the high dielectric include tantalum oxide and PZT (containing Pb(Zr, Ti)O$_3$) which also have an etch selectivity relative to polysilicon or amorphous silicon, silicon oxide and silicon nitride, permitting the removal of the dummy gate 3B with the interlayer insulation film 7 and the gate insulation film material 2 left unremoved.

There is a technique for manufacturing a MESFET which resembles the method of manufacturing the MISFET according to the first preferred embodiment of the present invention. An example of such a technique is a method of manufacturing a MESFET disclosed in Japanese Patent Application Laid-Open No. P06-342810A (1994) which comprises the steps of: forming a dummy gate on a semiconductor substrate by using a photoresist; implanting an impurity into the semiconductor substrate; reducing the gate length of the dummy gate; forming an insulation film to cover the dummy gate and the semiconductor substrate; removing the dummy gate and part of the insulation film which immediately overlies the dummy gate by a lift-off process; and filling a resultant space with a gate electrode material.

However, the method disclosed in Japanese Patent Application Laid-Open No. P06-342810A employs the lift-off process to remove the insulation film overlying the dummy gate, suffering from the constraint that the thickness of the insulation film serving as a frame of the dummy gate must be smaller (e.g., about twice smaller) than the height of the dummy gate. The insulation film which is too thick precludes the satisfactory removal of the dummy gate and the insulation film overlying the dummy gate. The method of manufacturing the MISFET according to the first preferred embodiment does not suffer from such a constraint, but may provide the dummy gate having a height equal to the thickness of the interlayer insulation film, eliminating the need to make the dummy gate higher than necessary.

Since the MESFET has no gate insulation film, the method disclosed in Japanese Patent Application Laid-Open No. P06-342810A does not form a film equivalent to the gate insulation film material 2 used in the method of manufacturing the MISFET according to the first preferred embodiment. However, the film equivalent to the gate insulation film material 2 functions not only as a gate insulation film but also as a Lt protective film for preventing the semiconductor substrate from being oxidized during the manufacturing process. Therefore, the method of manufacturing the MISFET according to the first preferred embodiment of the present invention is superior in semiconductor substrate protecting function to the method disclosed in Japanese Patent Application Laid-Open No. P06-342810A.

A technique described in a third preferred embodiment of the method disclosed in Japanese Patent Application Laid-Open No. P06-342810A shows an SiN film on the surface of the semiconductor substrate, although the SiN film does not serve as the gate insulation film material. It can be said that the SiN film has the semiconductor substrate protecting function. However, since the SiN film is removed when the gate electrode is formed, there is a likelihood that a channel layer of the semiconductor substrate is damaged during the removal process. In the method of manufacturing the MISFET according to the first preferred embodiment of the present invention, on the other hand, the gate insulation film material 2 is not removed, and therefore there is little likelihood that the channel layer of the semiconductor substrate 1 is damaged.

Another method of manufacturing a MESFET as disclosed in Japanese Patent Application Laid-Open No. P03-250741A (1991) also resembles the method of manufacturing the MISFET according to the first preferred embodiment of the present invention. However, the method of the first preferred embodiment of the present invention is superior to the method disclosed in Japanese Patent Application Laid-Open No. P03-250741A in that the gate insulation film material 2 is formed.

The use of the method of manufacturing the MISFET according to the first preferred embodiment of the present invention eliminates the need to take into consideration an etch selectivity between the gate electrode material and the gate insulation film material to manufacture the MISFET including the all-metal gate electrode. Further, this method employs isotropic etching to reduce the gate length of the dummy gate, achieving precise control of the gate length. Furthermore, since the gate insulation film and the dummy gate have the etch selectivity relative to each other and the interlayer insulation film and the dummy gate also have the etch selectivity relative to each other, there is little likelihood that the interlayer insulation film and the gate insulation film are damaged during the removal of the dummy gate. The presence of the gate insulation film prevents the semiconductor substrate from being damaged during the removal of the dummy gate. The method of the first preferred embodiment does not use the lift-off process to remove the interlayer insulation film overlying the dummy gate. This provides the dummy gate of a height equal to the thickness of the interlayer insulation film, eliminating the need to make the dummy gate higher than necessary. Moreover, the steps of gate length reduction and impurity implantation are repeated to provide the plurality of active regions and nonuniformly doped channel regions differing in concentration from each other in the surface of the semiconductor substrate on opposite sides of the gate electrode.

Second Preferred Embodiment

The method of manufacturing the MISFET according to a second preferred embodiment of the present invention is a modification of the method of the first preferred embodiment, and features the formation of the gate electrode having a gate length that is not greater than a minimum patterning size limit of the photolithographic technique. The method according to the second preferred embodiment will be described with reference to FIGS. 1, 2, and 18 through 24.

Initially, the gate insulation film material 2, the dummy gate material 3 and the photoresist 10 are stacked in the order named on the surface of the semiconductor substrate 1 such as a silicon substrate by the thermal oxidation, CVD or sputtering process, as in the first preferred embodiment. The photoresist 10 is patterned using the photolithographic technique (FIG. 1). Using the photoresist 10 as a mask, etching is performed to shape the dummy gate material 3. The photoresist 10 is then removed (FIG. 2).

Figure 18:
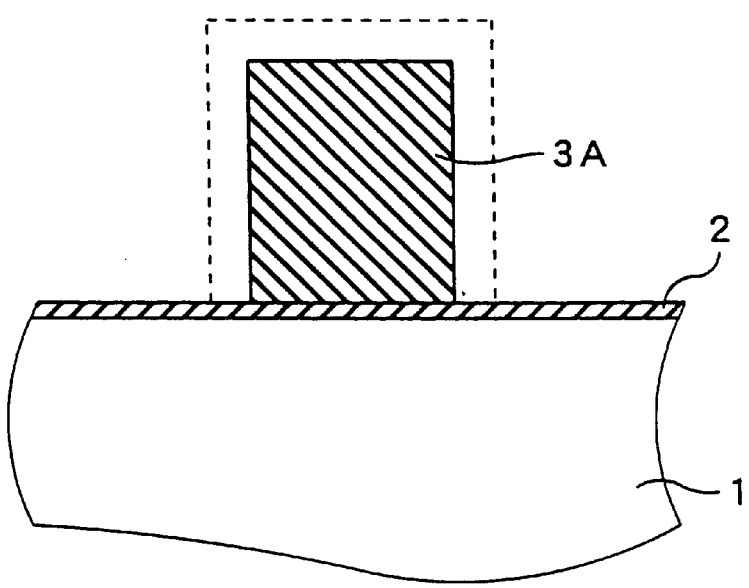
FIGS. 18 through 24 are cross-sectional views showing respective steps in a method of manufacturing a MISFET according to a second preferred embodiment of the present invention.

Next, isotropic etching is performed to reduce the gate length of the dummy gate 3, forming the dummy gate 3A (FIG. 18). Since the isotropic etching is used to reduce the gate length of the dummy gate 3, the gate length is accurately controlled by adjusting the etch time. This provides the gate electrode having the gate length that is not greater than the minimum patterning size limit of the photolithographic technique.

Figure 19:
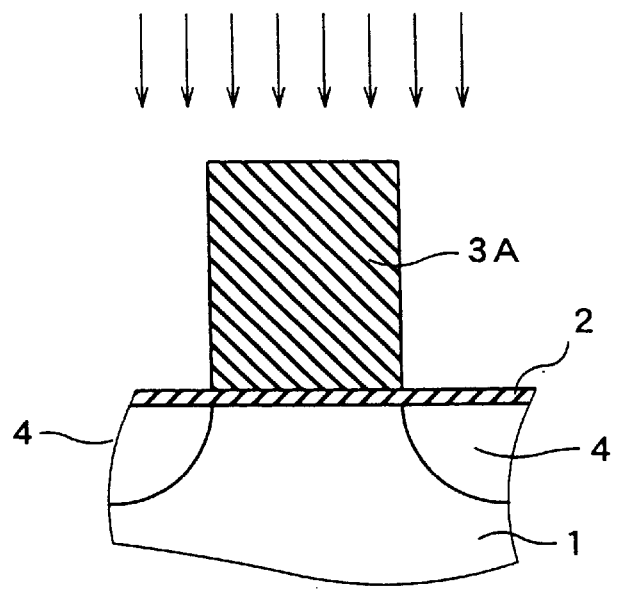
Figure 20:
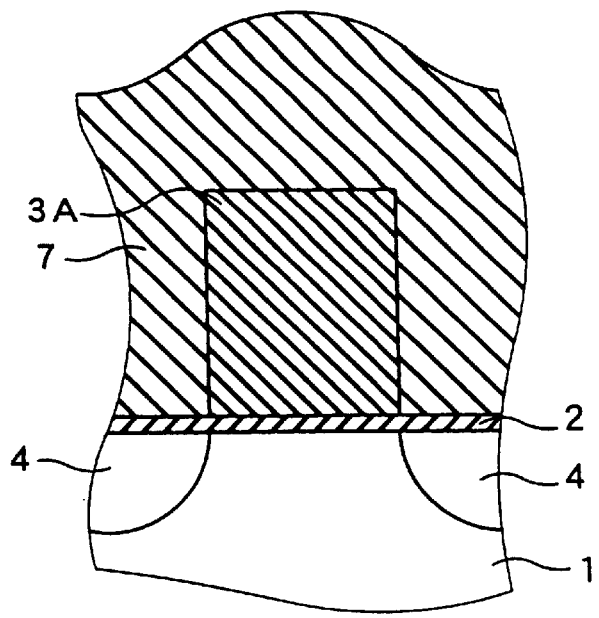

Then, an impurity is implanted into the semiconductor substrate 1 using the dummy gate 3A as a mask to form the active regions 4 having a relatively high concentration in the surface of the semiconductor substrate 1 in a self-aligned manner (FIG. 19). Thereafter, the interlayer insulation film 7 is formed on the entire top surface of the semiconductor substrate 1 using the CVD or sputtering process to cover the gate insulation film material 2 and the dummy gate 3A (FIG. 20).

Figure 21:
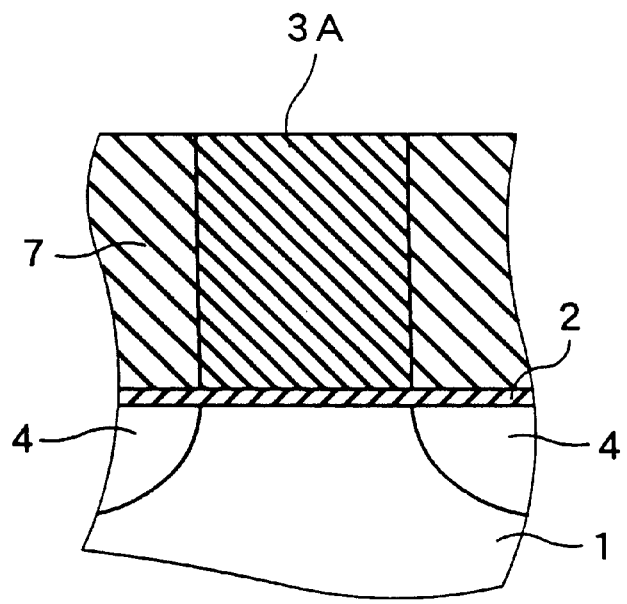
Figure 22:
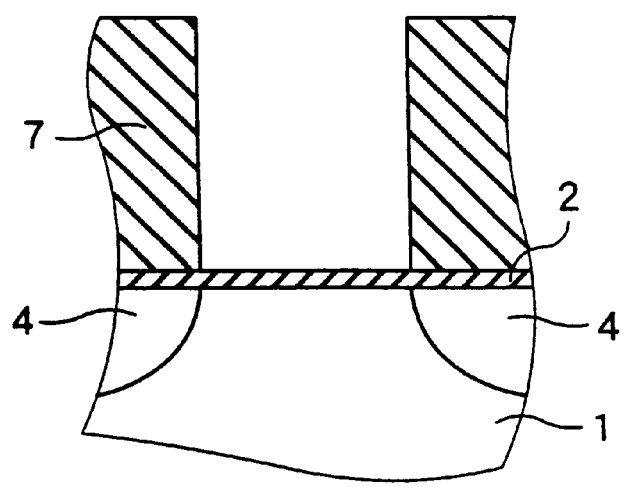

The interlayer insulation film 7 is polished by the CMP process for reduction in thickness until the top of the dummy gate 3A is exposed (FIG. 21). The dummy gate 3A is removed, with the interlayer insulation film 7 and the gate insulation film material 2 left unremoved (FIG. 22). The etch selectivities between the dummy gate 3A and the gate insulation film material 2 and between the dummy gate 3A and the interlayer insulation film 7 allow the removal of only the dummy gate 3A, as in the first preferred embodiment.

Figure 23:
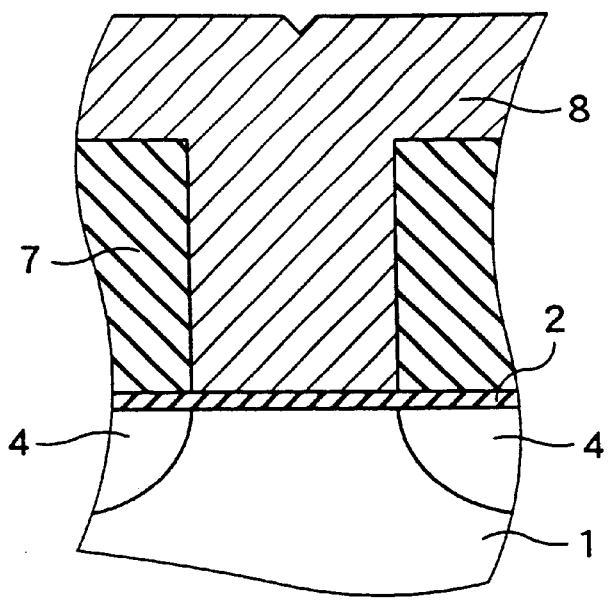
Figure 24:
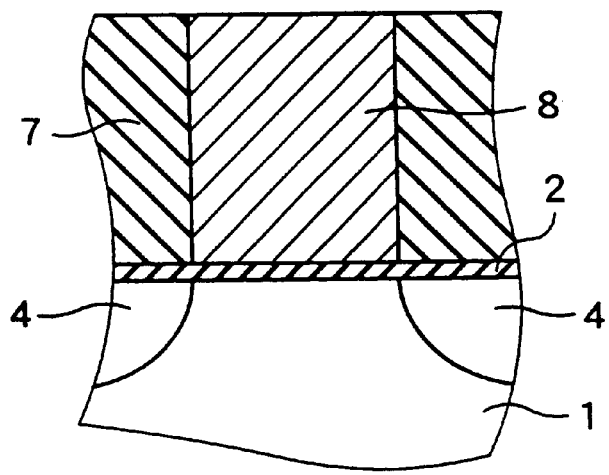

Subsequently, the gate electrode material 8 is formed using the CVD, sputtering or electroplating process to cover the gate insulation film material 2 and the interlayer insulation film 7 (FIG. 23). Part of the gate electrode material 8 which overlies the interlayer insulation film 7 is removed by etchback or the CMP process so that the gate electrode material 8 is left only in a region wherein the dummy gate 3A has been present (FIG. 24). Alternatively, the gate electrode material 8 may be patterned by a photolithographic technique in a manner described with reference to FIGS. 50 and 51.

This completes the MISFET including the gate electrode having the gate length that is not greater than the minimum patterning size limit of the photolithographic technique.

Although not formed in the above described steps, the active regions 5 and the nonuniformly doped channel regions 6 of the first preferred embodiment may be, of course, formed. In this case, the step of reducing the gate length of the dummy gate 3A and the step of implanting an impurity are repeated, as in the first preferred embodiment.

The materials, for example, shown in Table 1 in the first preferred embodiment may be used as the gate insulation film material 2, the dummy gate material 3 and the material of the interlayer insulation film 7.

The use of the method of manufacturing the MISFET according to the second referred embodiment of the present invention provides the gate electrode having the gate length that is not greater than the minimum patterning size limit of the photolithographic technique, while producing the effect of the method of the first preferred embodiment.

Third Preferred Embodiment

The method of manufacturing the MISFET according to a third preferred embodiment of the present invention is another modification of the method of the first preferred embodiment, and features the formation of the gate electrode of a T-shaped configuration. The T-shaped gate electrode, which has an upper part of an increased gate length, is low in electric resistance and is easy to contact in the upper part. The method according to the third preferred embodiment will be described with reference to FIGS. 25 through 35.

Figure 25:
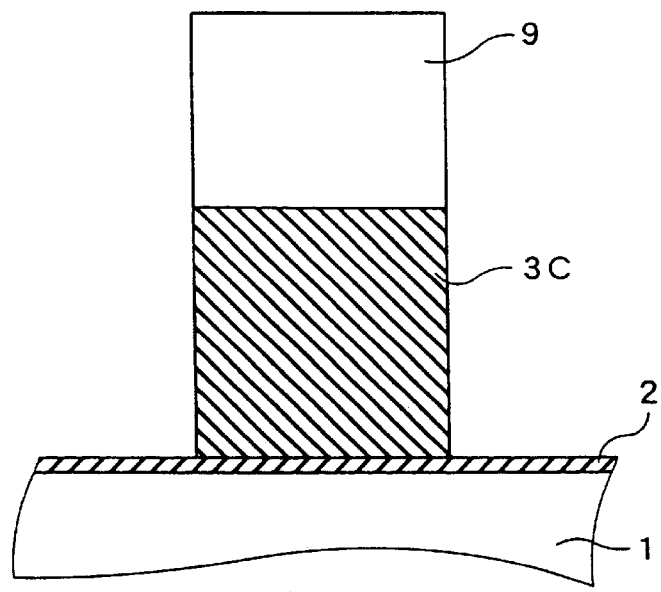
FIGS. 25 through 40 are cross-sectional views showing respective steps in a method of manufacturing a MISFET according to a third preferred embodiment of the present invention.

Initially, the gate insulation film material 2, the material of a lower dummy gate part 3C, the material of an upper dummy gate part 9 and a photoresist are stacked in the order named on the surface of the semiconductor substrate 1 such as a silicon substrate by the thermal oxidation, CVD or sputtering process. The photoresist is patterned using the photolithographic technique. Using the photoresist as a mask, etching is performed to shape the lower dummy gate part 3C and the upper dummy gate part 9. The photoresist is then removed (FIG. 25). Silicon oxide, for example, is used as the gate insulation film material 2, as in the first preferred embodiment. The lower dummy gate part 3C used herein is made of a material having an etch selectivity relative to the gate insulation film material 2. When the gate insulation film material 2 is silicon oxide, an example of the material of the lower dummy gate part 3C is silicon nitride. The upper dummy gate part 9 used herein is made of a material having an etch selectivity relative to the lower dummy gate part 3C. When the material of the lower dummy gate part 3C is silicon nitride, an example of the material of the upper dummy gate part 9 is polysilicon.

Figure 26:
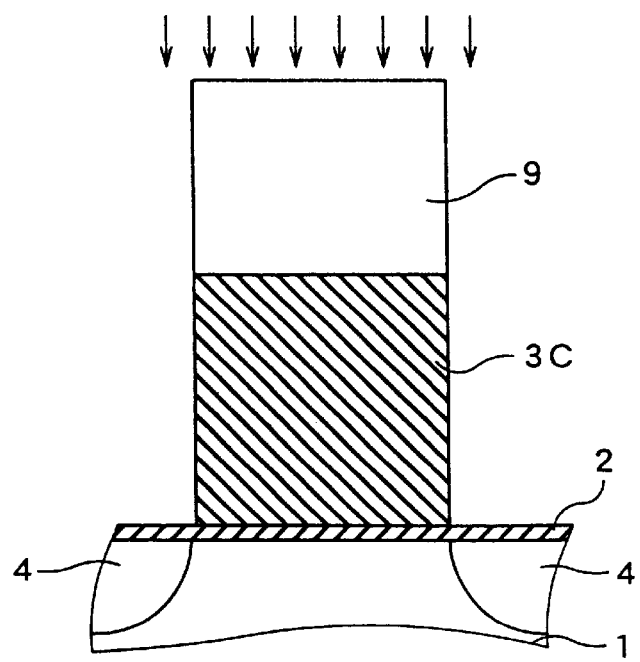

Next, an impurity is implanted into the semiconductor substrate 1 using the upper dummy gate part 9 and the lower dummy gate part 3C as a mask to form the active regions 4 having a relatively high concentration in the surface of the semiconductor substrate 1 in a self-aligned manner (FIG. 26).

Figure 27:
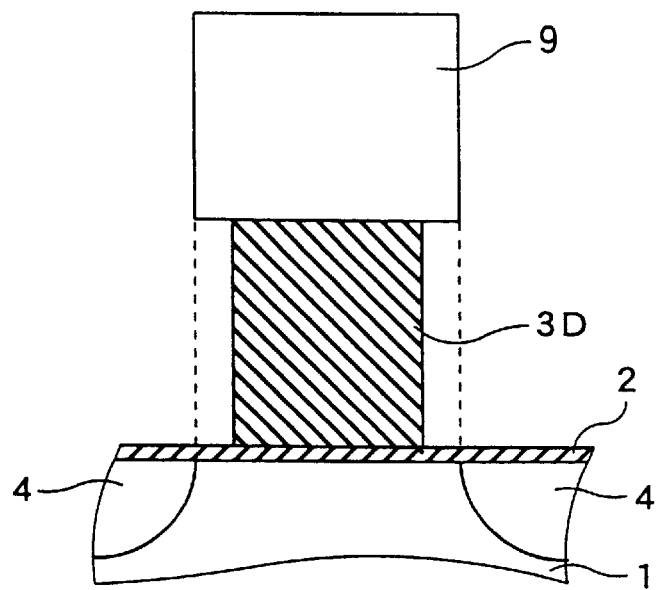

Subsequently, isotropic etching is performed only on the lower dummy gate part 3C to reduce the gate length of the lower dummy gate part 3C, forming a lower dummy gate part 3D (FIG. 27). The use of the material of the upper dummy gate part 9 having the etch selectivity relative to the lower dummy gate part 3C permits only the lower dummy gate part 3C to be isotropically etched. Since the isotropic etching is used to reduce the gate length of the lower dummy gate part 3C, the gate length is accurately controlled by adjusting the etch time.

Figure 28:
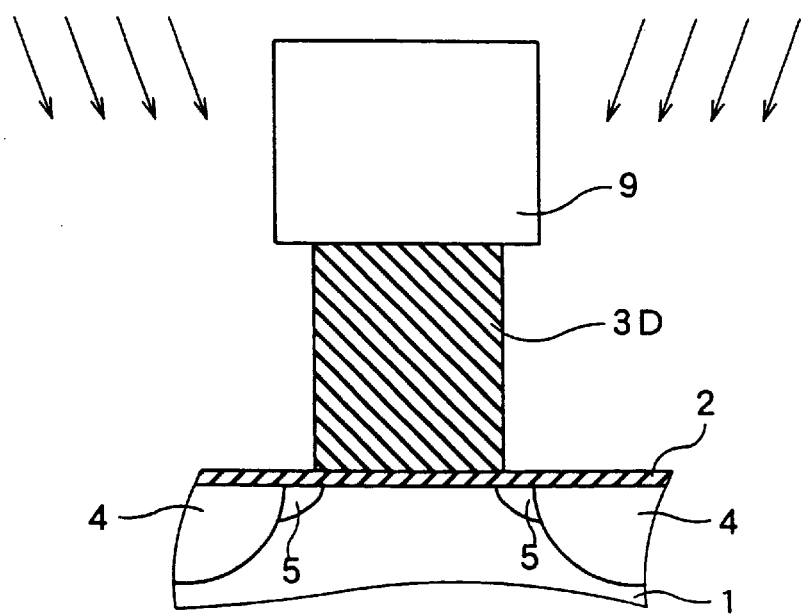

Then, an impurity is implanted into the semiconductor substrate 1 using the upper dummy gate part 9 and the lower dummy gate part 3D as a mask to form the active regions 5 having a concentration relatively lower than that of the active regions 4 in the surface of the semiconductor substrate 1 in a self-aligned manner (FIG. 28). In this step, if the impurity is vertically downwardly implanted, the upper dummy gate part 9 blocks the active regions 5 from being formed as the LDD regions. Hence, the oblique-rotating ion implantation technique or the like is used to form the active regions 5 between the outer periphery of the lower dummy gate part 3D and the inner end of the active regions 4.

Figure 29:
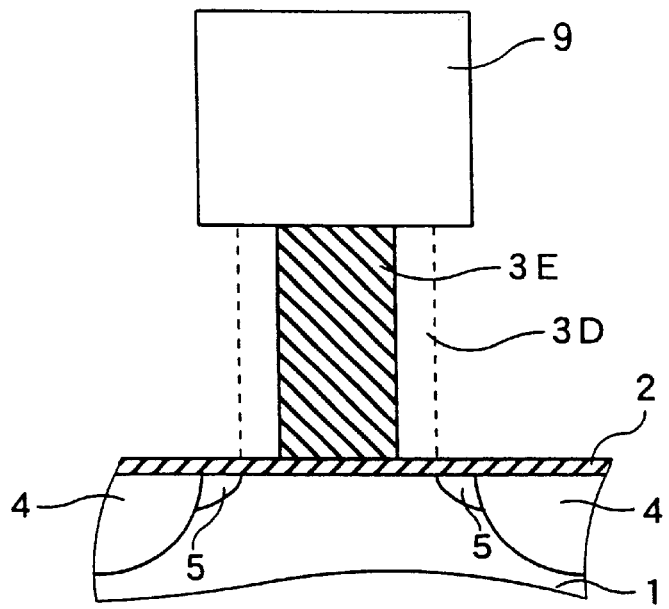

In a manner described above, isotropic etching is performed only on the lower dummy gate part 3D to further reduce the gate length of the lower dummy gate part 3D, forming a lower dummy gate part 3E (FIG. 29).

Figure 30:
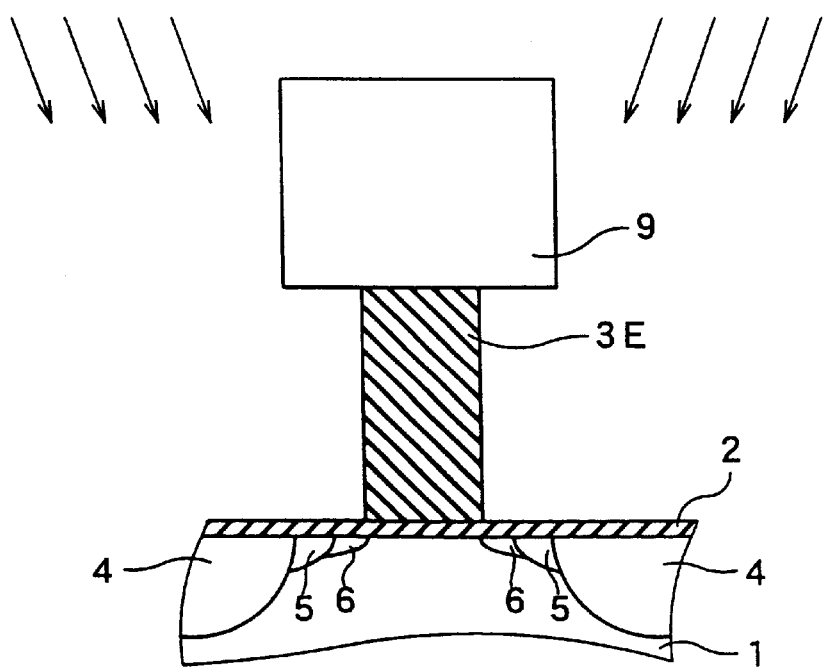

Then, an impurity is implanted into the semiconductor substrate 1 by the oblique-rotating ion implantation technique or the like, using the upper dummy gate part 9 and the lower dummy gate part 3E as a mask in the above described manner to form the nonuniformly doped channel regions 6 having an impurity characteristic opposite from that of the active regions 4 and 5 and a relatively high concentration in the surface of the semiconductor substrate 1 in a self-aligned manner (FIG. 30).

Figure 31:
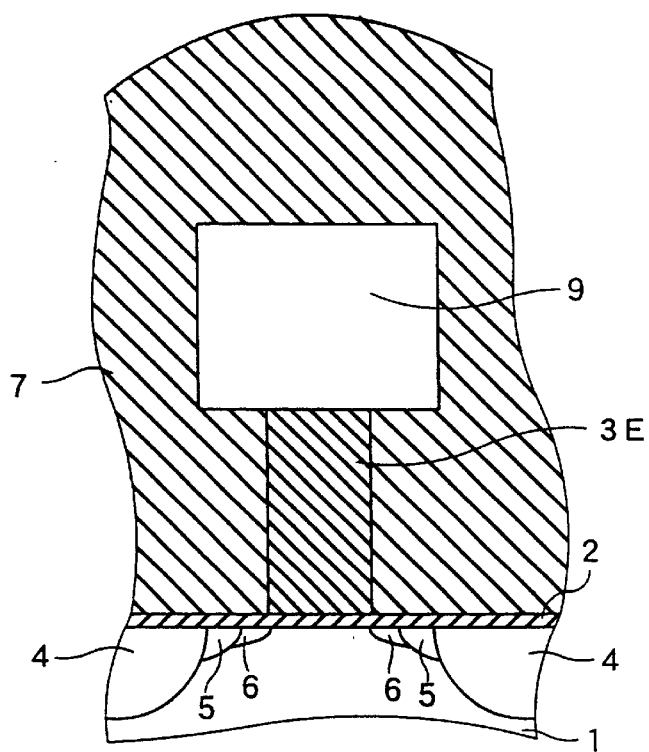

Thereafter, the interlayer insulation film 7 is formed on the entire top surface of the semiconductor substrate 1 using the CVD or sputtering process to cover the gate insulation film material 2 and the upper and lower dummy gate parts 9 and 3E (FIG. 31). The interlayer insulation film 7 is made of a material having an etch selectivity relative to both of the upper dummy gate part 9 and the lower dummy gate part 3E. When the material of the lower dummy gate part 3E is silicon nitride and the material of the upper dummy gate part 9 is polysilicon, the interlayer insulation film 7 is made of, for example, silicon oxide.

Figure 32:
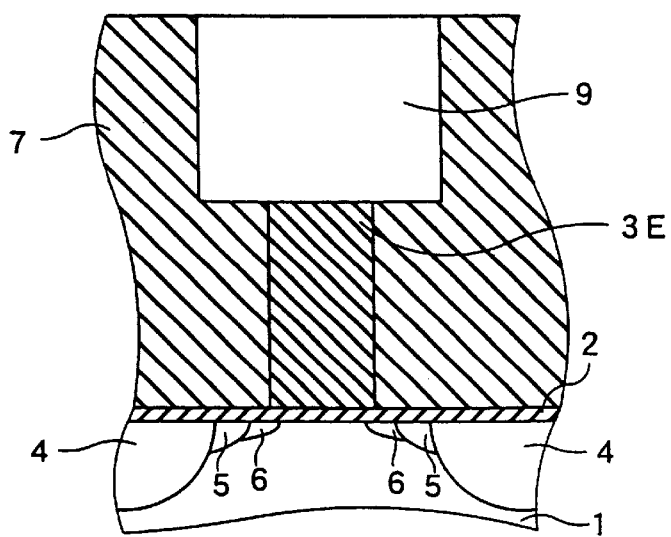
Figure 33:
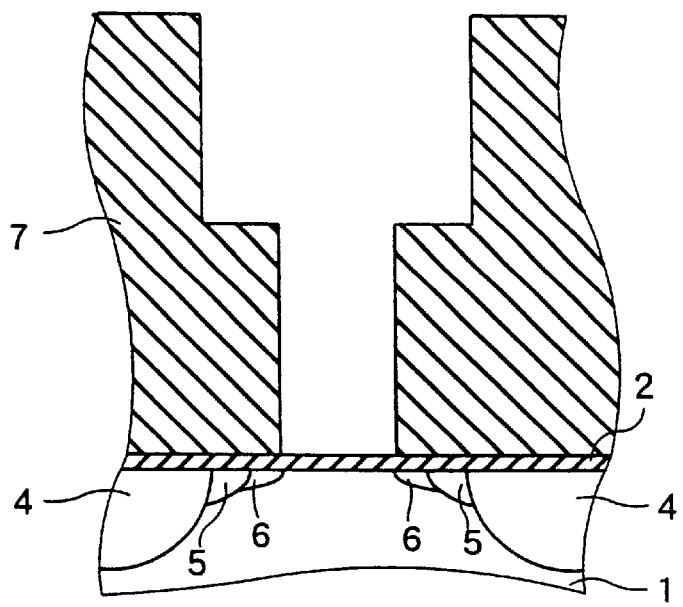

The interlayer insulation film 7 is polished by the CMP process for reduction in thickness until the top of the upper dummy gate part 9 is exposed (FIG. 32). The upper dummy gate part 9 and the lower dummy gate part 3E are removed, with the interlayer insulation film 7 and the gate insulation film material 2 left unremoved (FIG. 33). The above described etch selectivities between the lower dummy gate part 3E and the gate insulation film material 2 and between the upper and lower dummy gate parts 9, 3E and the interlayer insulation film 7 allow the removal of only the upper and lower dummy gate parts 9 and 3E.

Figure 34:
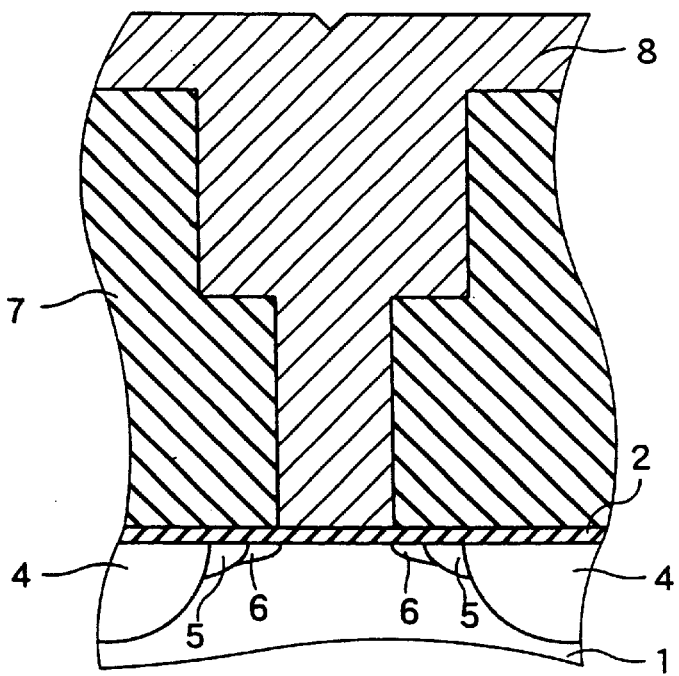
Figure 35:
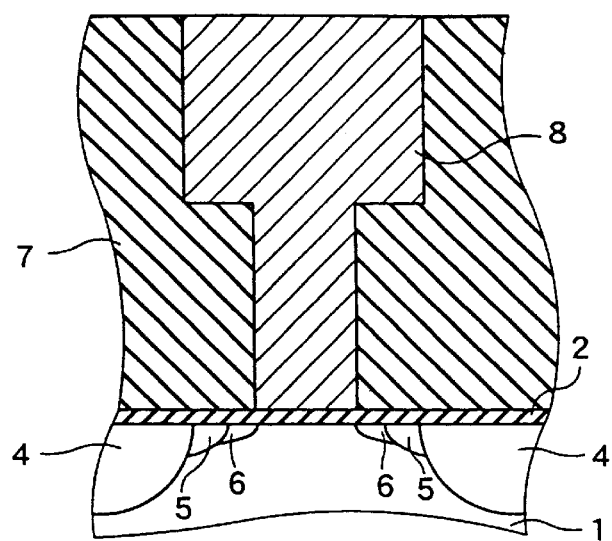

Subsequently, the gate electrode material 8 is formed using the CVD, sputtering or electroplating process to cover the gate insulation film material 2 and the interlayer insulation film 7 (FIG. 34). Part of the gate electrode material 8 which overlies the interlayer insulation film 7 is removed by etchback or the CMP process so that the gate electrode material 8 is left only in a region wherein the upper and lower dummy gate parts 9 and 3E have been present (FIG. 35). Alternatively, the gate electrode material 8 may be patterned by a photolithographic technique in a manner described with reference to FIGS. 50 and 51.

This completes the MISFET including the T-shaped gate electrode.

Figure 36:
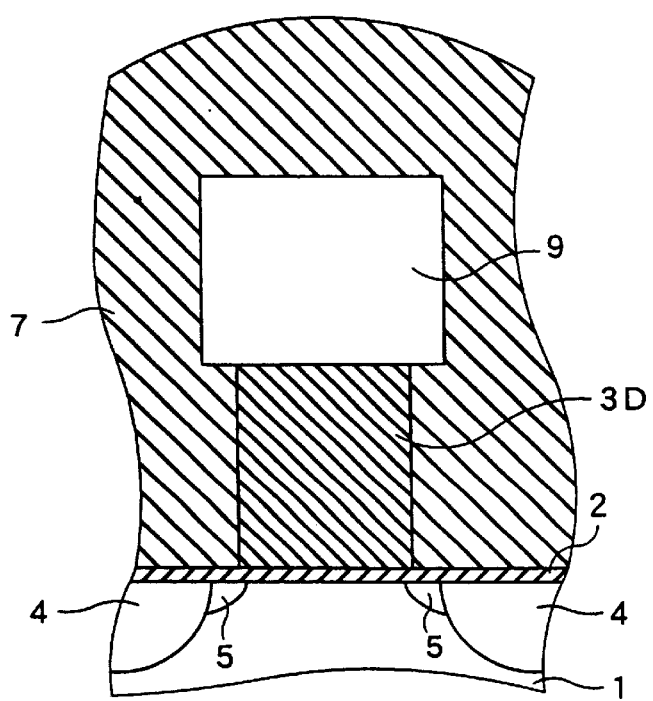
Figure 37:
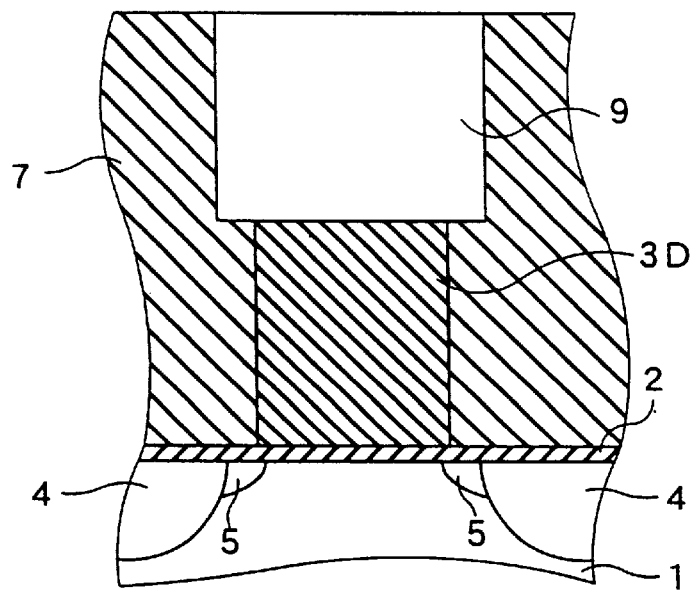
Figure 38:
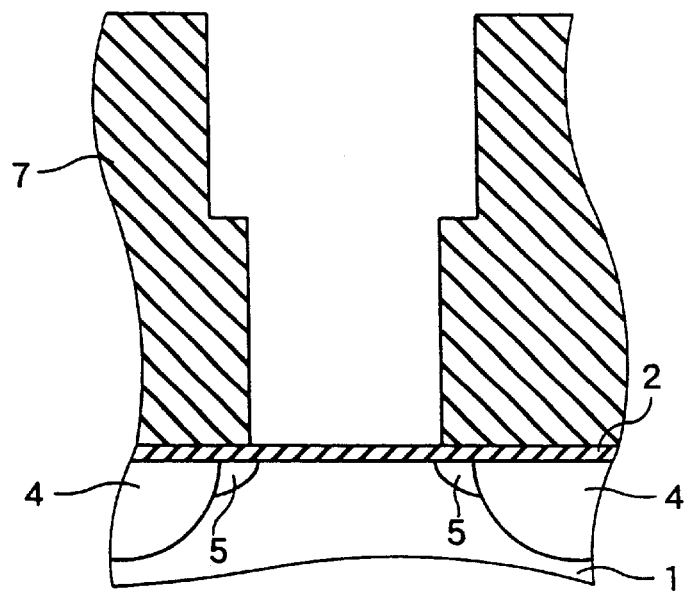
Figure 39:
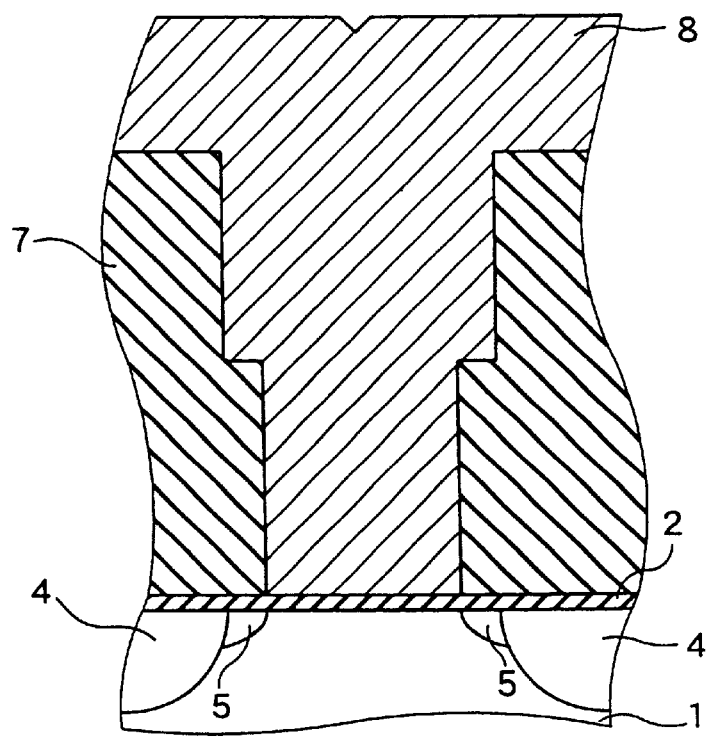
Figure 40:
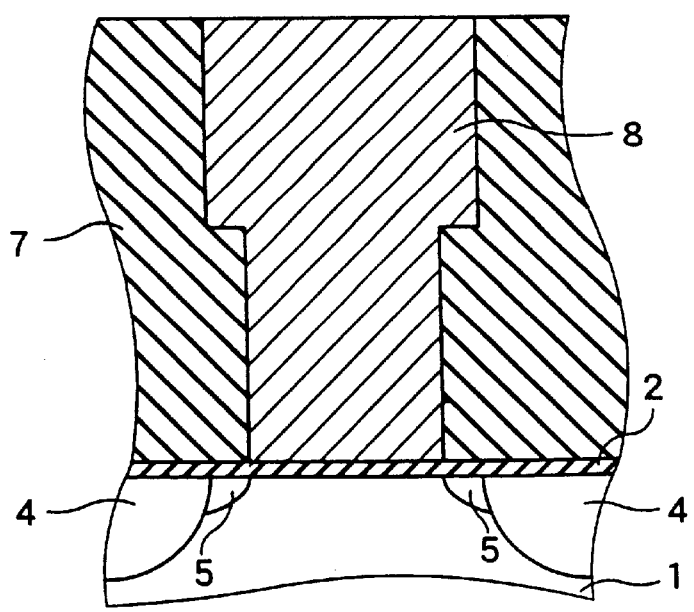

The above-mentioned step of forming the nonuniformly doped channel regions 6 may be eliminated. In this case, the steps shown in FIGS. 36 through 40 are performed after the step, shown in FIG. 28, of forming the active regions 5 in the surface of the semiconductor substrate 1. More specifically, after the step shown in FIG. 28, the interlayer insulation film 7 is formed on the entire top surface of the semiconductor substrate 1 using the CVD or sputtering process to cover the gate insulation film material 2 and the upper and lower dummy gate parts 9 and 3D (FIG. 36). The interlayer insulation film 7 is polished by the CMP process for reduction in thickness until the top of the upper dummy gate part 9 is exposed (FIG. 37). The upper and lower dummy gate parts 9 and 3D are removed, with the interlayer insulation film 7 and the gate insulation film material 2 left unremoved (FIG. 38). Subsequently, the gate electrode material 8 is formed using the CVD, sputtering or electroplating process to cover the gate insulation film material 2 and the interlayer insulation film 7 (FIG. 39). Part of the gate electrode material 8 which overlies the interlayer insulation film 7 is removed by etchback or the CMP process so that the gate electrode material 8 is left only in a region wherein the upper and lower dummy gate parts 9 and 3D have been present (FIG. 40). Alternatively, the gate electrode material 8 may be patterned by a photolithographic technique in a manner described with reference to FIGS. 50 and 51.

The gate insulation film material 2, the materials of the upper and lower dummy gate parts 9 and 3C and the material of the interlayer insulation film 7 are not limited to silicon oxide, silicon nitride and polysilicon, but are required only to have the above described etch selectivity. Table 2 shows an example of combinations of the gate insulation film material 2, the materials of the upper and lower dummy gate parts 9 and 3C and the material of the interlayer insulation film 7.

TABLE 2

| gate insulation film 2 | lower dummy gate part 3C | upper dummy gate part 9 | interlayer insulation film 7 |
| --- | --- | --- | --- |
| silicon oxide | silicon nitride | poly/amorphous silicon | silicon oxide |
|  | poly/amorphous silicon | silicon oxide | silicon nitride |
|  | silicon oxide | silicon nitride | silicon oxide |
| silicon oxynitride | poly/amorphous silicon | silicon oxide | silicon nitride |
|  | silicon oxide | silicon nitride | silicon oxide |
|  | silicon oxide | poly/amorphous silicon | silicon nitride |
| high dielectric | silicon nitride | poly/amorphous silicon | silicon oxide |
|  | poly/amorphous silicon | silicon nitride | silicon oxide |
|  | silicon oxide | silicon oxide | silicon nitride |
|  | silicon oxide | poly/amorphous silicon | silicon nitride |

Polysilicon or amorphous silicon, silicon oxide and silicon nitride have an etch selectivity relative to each other, and therefore may be used in combination as shown in Table 2 for the parts of the MISFET. This permits the etching of the lower dummy gate part 3C without etching the upper dummy gate part 9, and also permits the removal of the upper and lower dummy gate parts 9 and 3C, with the interlayer insulation film 7 and the gate insulation film material 2 left unremoved.

As shown in Table 2, silicon oxynitride may be used as the gate insulation film material 2. In this case, if silicon oxynitride has a nitrogen content higher than an oxygen content, silicon oxide may be used for the lower dummy gate part 3C as shown in Table 2. However, if silicon oxynitride has an oxygen content higher than a nitrogen content, silicon nitride and silicon oxide may be used for the lower dummy gate part 3C and the interlayer insulation film 7, respectively.

Silicon nitride may be used as the gate insulation film material 2 where feasible. Materials to be used in this case for the upper and lower dummy gate parts 9 and 3C and the interlayer insulation film 7 may be similar to those used when the gate insulation film material 2 is silicon oxynitride in Table 2.

Alternatively, a high dielectric may be used as the gate insulation film material 2.

The use of the method of manufacturing the MISFET according to the third preferred embodiment of the present invention provides the gate electrode which is low in electric resistance and which has an easy-to-contact upper part, while producing the effect of the method of the first preferred embodiment. Further, this method employs isotropic etching to reduce the gate length of the lower dummy gate part, achieving precise control of the gate length.

Furthermore, since the gate insulation film and the lower dummy gate part have the etch selectivity relative to each other and the interlayer insulation film and the upper and lower dummy gate parts also have the etch selectivity relative to each other, there is little likelihood that the interlayer insulation film and the gate insulation film are damaged during the removal of the dummy gate. The presence of the gate insulation film prevents the semiconductor substrate from being damaged during the removal of the dummy gate. Moreover, the plurality of active regions and nonuniformly doped channel regions differing in concentration from each other are formed in the surface of the semiconductor substrate on opposite sides of the gate electrode.

Fourth Preferred Embodiment

The method of manufacturing the MISFET according to a fourth preferred embodiment of the present invention is a modification of the method of the third preferred embodiment, and features the formation of the T-shaped gate electrode having a gate length that is not greater than the minimum patterning size limit of the photolithographic technique. The method according to the fourth preferred embodiment will be described with reference to FIGS. 25, and 41 through 47.

Initially, the gate insulation film material 2, the material of the lower dummy gate part 3C, the material of the upper dummy gate part 9 and the photoresist are stacked in the order named on the surface of the semiconductor substrate 1 such as a silicon substrate by the thermal oxidation, CVD or sputtering process, as in the third preferred embodiment. The photoresist is patterned using the photolithographic technique. Using the photoresist as a mask, etching is performed to shape the lower dummy gate part 3C and the upper dummy gate part 9. The photoresist is then removed (FIG. 25).

Figure 41:
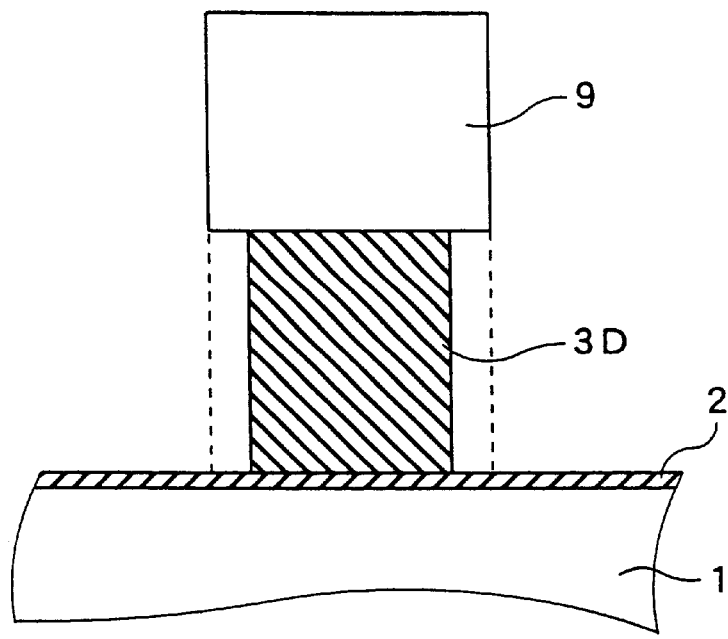
FIGS. 41 through 47 are cross-sectional views showing respective steps in a method of manufacturing a MISFET according to a fourth preferred embodiment of the present invention.

Next, isotropic etching is performed only on the lower dummy gate part 3C to reduce the gate length of the lower dummy gate part 3C, forming the lower dummy gate part 3D (FIG. 41). Since the isotropic etching is used to reduce the gate length of the lower dummy gate part 3C, the gate length is accurately controlled by adjusting the etch time. This provides the gate electrode having the gate length that is not greater than the minimum patterning size limit of the photolithographic technique.

Figure 42:
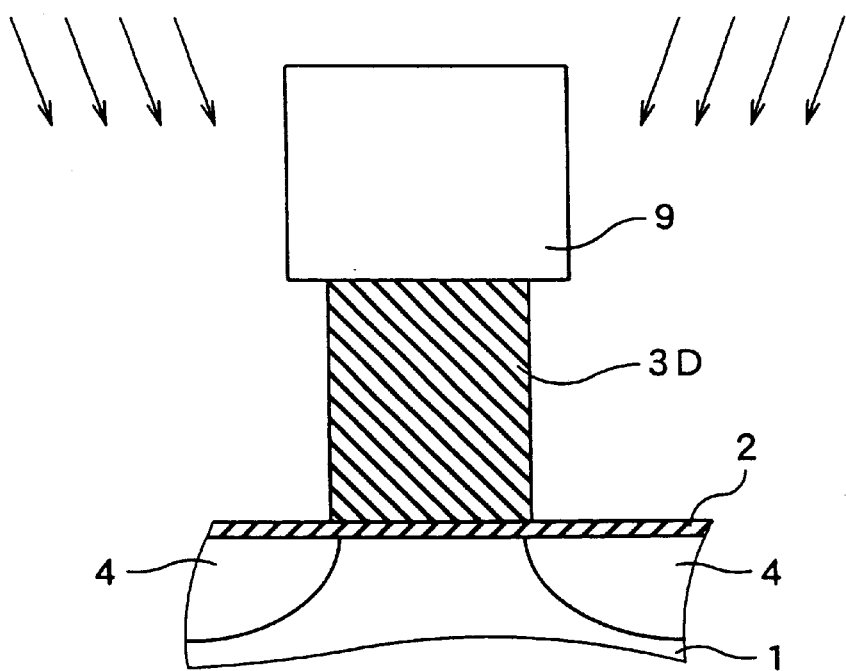
Figure 43:
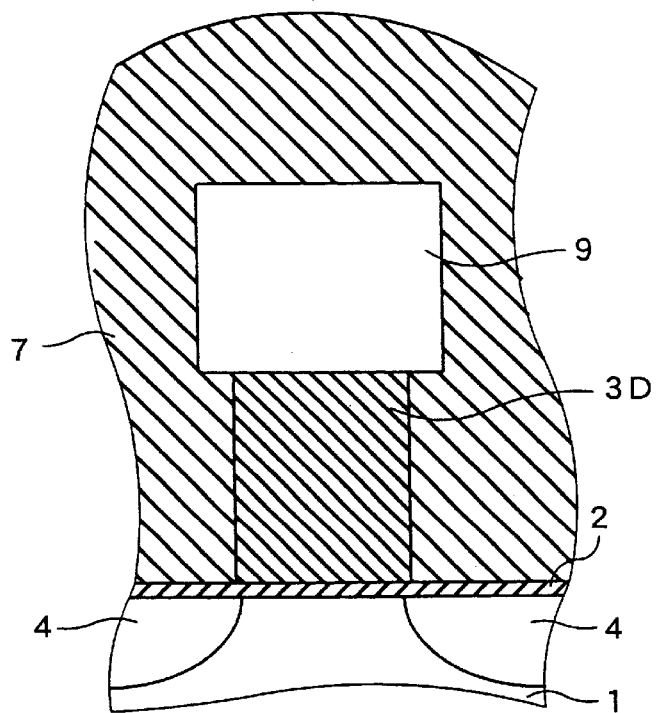

Then, an impurity is implanted into the semiconductor substrate 1 by the oblique-rotating ion implantation technique or the like, using the upper dummy gate part 9 and the lower dummy gate part 3D as a mask to form the active regions 4 having a relatively high concentration in the surface of the semiconductor substrate 1 in a self-aligned manner (FIG. 42). Thereafter, the interlayer insulation film 7 is formed on the entire top surface of the semiconductor substrate 1 using the CVD or sputtering process to cover the gate insulation film material 2 and the upper and lower dummy gate parts 9 and 3D (FIG. 43).

Figure 44:
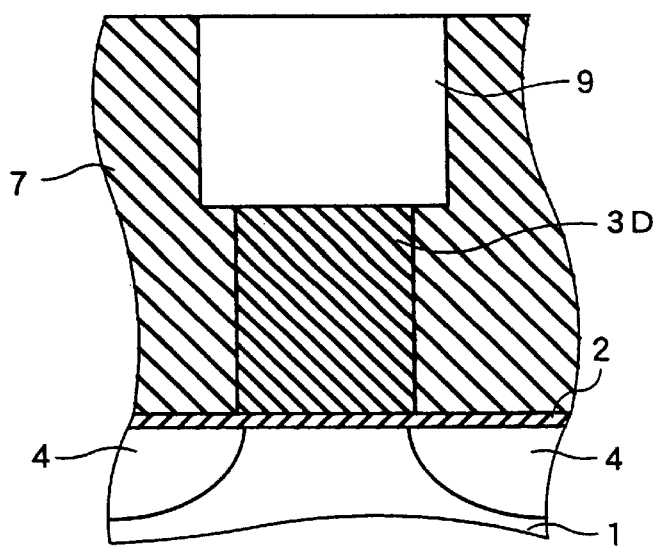
Figure 45:
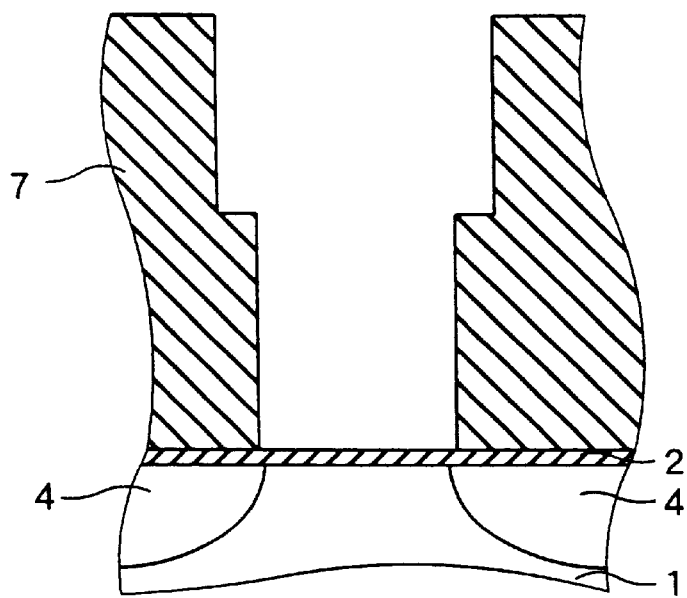

The interlayer insulation film 7 is polished by the CMP process for reduction in thickness until the top of the upper dummy gate part 9 is exposed (FIG. 44). The upper and lower dummy gate parts 9 and 3D are removed, with the interlayer insulation film 7 and the gate insulation film material 2 left unremoved (FIG. 45). The etch selectivities between the lower dummy gate part 3D and the gate insulation film material 2 and between the upper and lower dummy gate parts 9, 3D and the interlayer insulation film 7 allow the removal of only the upper and lower dummy gate parts 9 and 3D, as in the third preferred embodiment.

Figure 46:
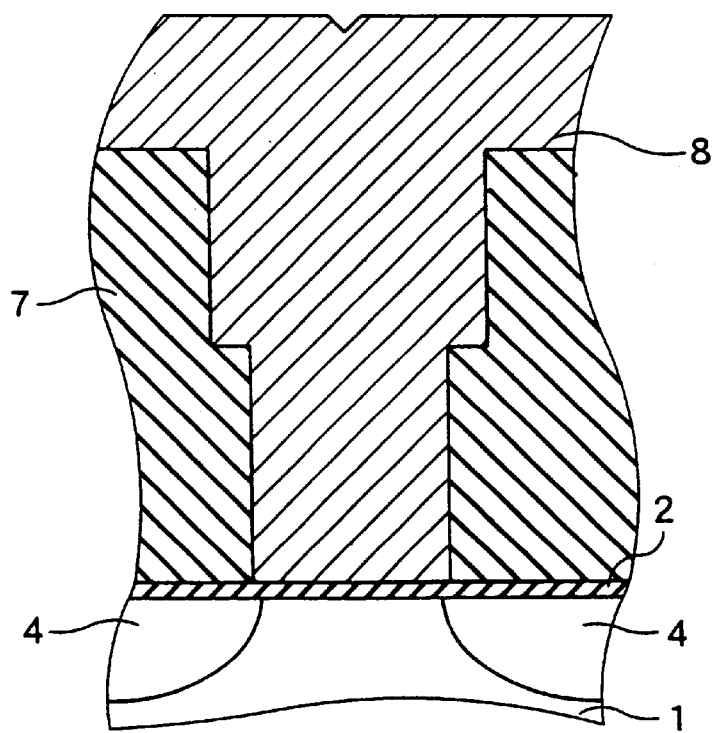
Figure 47:
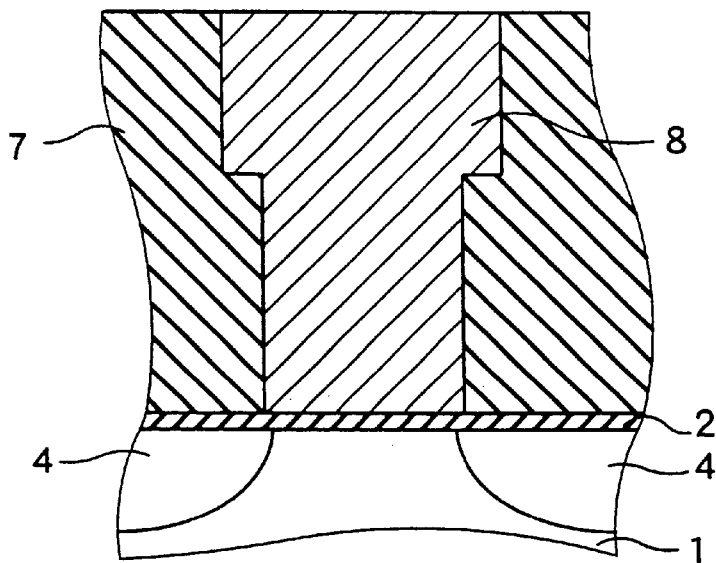
Figure 48:
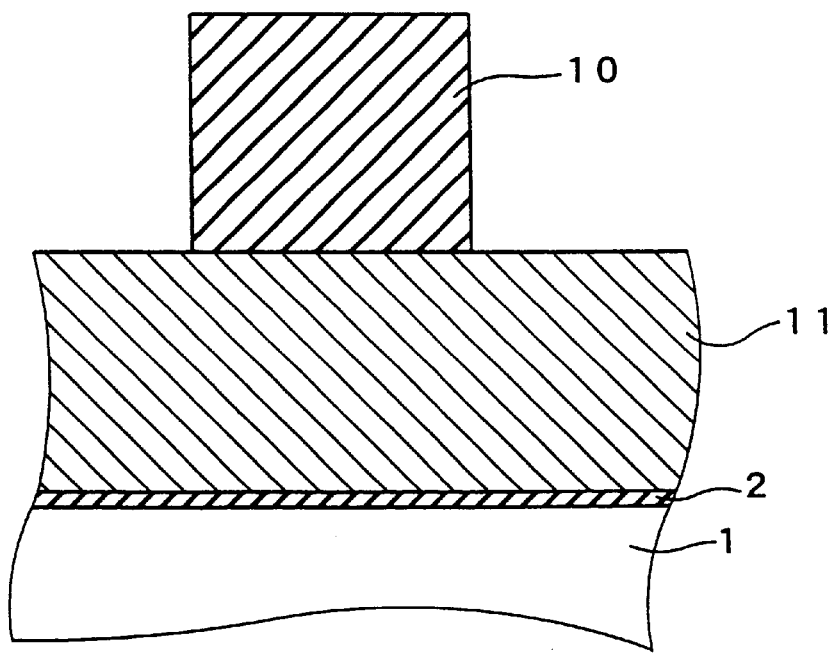
FIGS. 48 and 49 are cross-sectional views showing respective steps in a background art method of manufacturing a MISFET.
Figure 49:
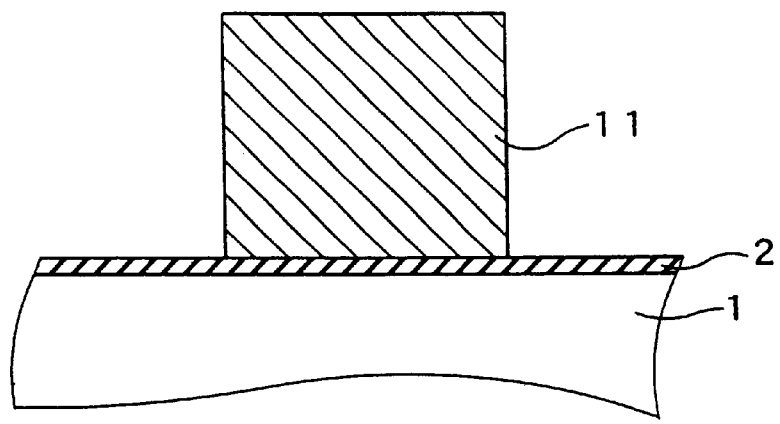

Subsequently, the gate electrode material 8 is formed using the CVD, sputtering or electroplating process to cover the gate insulation film material 2 and the interlayer insulation film 7 (FIG. 46). Part of the gate electrode material 8 which overlies the interlayer insulation film 7 is removed by etchback or the CMP process so that the gate electrode material 8 is left only in a region wherein the upper and lower dummy gate parts 9 and 3D have been present (FIG. 47). Alternatively, the gate electrode material 8 may be patterned by a photolithographic technique in a manner described with reference to FIGS. 50 and 51.

This completes the MISFET including the T-shaped gate electrode having the gate length that is not greater than the minimum patterning size limit of the photolithographic technique.

Although not formed in the above described steps, the active regions 5 and the nonuniformly doped channel regions 6 of the third preferred embodiment may be, of course, formed. In this case, the step of reducing the gate length of the lower dummy gate part 3D and the step of implanting an impurity are repeated, as in the third preferred embodiment.

The materials, for example, shown in Table 2 in the third preferred embodiment may be used as the gate insulation film material 2, the materials of the upper and lower dummy gate parts 9 and 3D and the material of the interlayer insulation film 7.

The use of the method of manufacturing the MISFET according to the fourth preferred embodiment of the present invention provides the T-shaped gate electrode having the gate length that is not greater than the minimum patterning size limit of the photolithographic technique, while producing the effect of the method of the third preferred embodiment.

While the invention has been described in detail, the foregoing description is in all aspects illustrative and not restrictive. It is understood that numerous other modifications and variations can be devised without departing from the scope of the invention.

What is claimed is:

1. A method of manufacturing a MISFET, comprising the steps of:
    (a) preparing a semiconductor substrate;
    (b) forming a gate insulation film on a surface of said semiconductor substrate;
    (c) forming a dummy gate on and in contact with a surface of said gate insulation film;
    (d) implanting an impurity into said semiconductor substrate in a self-aligned manner, using said dummy gate as a mask;
    (e) forming an interlayer insulation film covering said dummy gate to cover the surface of said semiconductor substrate entirely;
    (f) reducing the thickness of said interlayer insulation film to expose a top surface of said dummy gate;
    (g) removing said dummy gate, with said interlayer insulation film and said gate insulation film unremoved; and
    (h) forming a gate electrode on and in contact with said surface of said gate insulation film in a space created by the removal of said dummy gate.

2. The method according to claim 1,
    wherein the thickness of said interlayer insulation film is reduced by a chemical mechanical polishing process in said step (f).

3. The method according to claim 2,
    wherein said dummy gate and said interlayer insulation film are made of respective materials capable of providing a polish selectivity between said dummy gate and said interlayer insulation film; and
    wherein said step (f) comprises the step of providing the polish selectivity between said dummy gate and said interlayer insulation film to perform the chemical mechanical polishing process on said interlayer insulation film.

4. The method according to claim 1,
    wherein said gate insulation film, said dummy gate and said interlayer insulation film are made of respective materials capable of providing an etch selectivity between said gate insulation film and said dummy gate and an etch selectivity between said interlayer insulation film and said dummy gate; and
    wherein said step (g) comprises the step of providing the etch selectivity between said gate insulation film and said dummy gate and the etch selectivity between said interlayer insulation film and said dummy gate to etch said dummy gate.

5. The method according to claim 1, further comprising the step of
    (i) reducing a gate length of said dummy gate.

6. The method according to claim 5,
    wherein said steps (d) and (i) are repeated a plurality of times before said step (e).

7. The method according to claim 5,
    wherein said gate insulation film, said dummy gate and said interlayer insulation film are made of respective materials capable of providing an etch selectivity between said gate insulation film and said dummy gate and an etch selectivity between said interlayer insulation film and said dummy gate;
    wherein said step (g) comprises the step of providing the etch selectivity between said gate insulation film and said dummy gate and the etch selectivity between said interlayer insulation film and said dummy gate to etch said dummy gate; and
    wherein said step (i) comprises the step of providing the etch selectivity between said gate insulation film and said dummy gate to isotropically etch said dummy gate.

8. The method according to claim 7,
    wherein said steps (d) and (i) are repeated a plurality of times before said step (e).

9. The method according to claim 5,
    wherein said dummy gate has an upper part and a lower part; and
    wherein the gate length of only said lower part of said dummy gate is reduced in said step (i).

10. The method according to claim 9,
    wherein the thickness of said interlayer insulation film is reduced by a chemical mechanical polishing process in said step (f).

11. The method according to claim 10,
    wherein said upper part of said dummy gate and said interlayer insulation film are made of respective materials capable of providing a polish selectivity between said upper part of said dummy gate and said interlayer insulation film; and
    wherein said step (f) comprises the step of providing the polish selectivity between said upper part of said dummy gate and said interlayer insulation film to perform the chemical mechanical polishing process on said interlayer insulation film.

12. The method according to claim 9, wherein said steps (d) and (i) are repeated a plurality of times before said step (e).

13. The method according to claim 12, wherein, when said step (d) is performed after said step (i), said step (d) includes the step of implanting an impurity into part of said semiconductor substrate which lies between an end of said lower part of said dummy gate and an end of said upper part of said dummy gate in a self-aligned manner, using said upper and lower parts of said dummy gate as a mask.

14. The method according to claim 9, wherein said gate insulation film, said upper part and said lower part of said dummy gate and said interlayer insulation film are made of respective materials capable of providing an etch selectivity between said gate insulation film and said lower part of said dummy gate, an etch selectivity between said lower part of said dummy gate and said upper part of said dummy gate, an etch selectivity between said upper part of said dummy gate and said interlayer insulation film, and an etch selectivity between said lower part of said dummy gate and said interlayer insulation film;

wherein said step (g) comprises the step of providing the etch selectivity between said gate insulation film and said lower part of said dummy gate, the etch selectivity between said upper part of said dummy gate and said interlayer insulation film and the etch selectivity between said lower part of said dummy gate and said interlayer insulation film to etch said upper and lower parts of said dummy gate; and wherein said step (i) comprises the step of providing the etch selectivity between said gate insulation film and said lower part of said dummy gate and the etch selectivity between said lower part of said dummy gate and said upper part of said dummy gate to isotropically etch said lower part of said dummy gate.

15. The method according to claim 14, wherein said steps (d) and (i) are repeated a plurality of times before said step (e).

16. The method according to claim 15, wherein, when said step (d) is performed after said step (i), said step (d) includes the step of implanting an impurity into part of said semiconductor substrate which lies between an end of said lower part of said dummy gate and an end of said upper part of said dummy gate in a self-aligned manner, using said upper and lower parts of said dummy gate as a mask.

17. A method of manufacturing a MISFET; comprising the steps of:

(a) preparing a semiconductor substrate;

(b) forming a gate insulation film on a surface of said semiconductor substrate;

(c) forming a dummy gate on a surface of said gate insulation film;

(d) implanting an impurity into said semiconductor substrate in a self-aligned manner, using said dummy gate as a mask;

(e) forming an interlayer insulation film covering said dummy gate to cover the surface of said semiconductor substrate entirely;

(f) reducing the thickness of said interlayer insulation film to expose a top surface of said dummy gate;

(g) removing said dummy gate, with said interlayer insulation film and said gate insulation film unremoved;

(h) forming a gate electrode on said surface of said gate insulation film in a space created by the removal of said dummy gate; and (i) reducing a gate length of said dummy gate.

* * * * *